United States Patent [19]

Nakajima et al.

[11] Patent Number: 4,977,444
[45] Date of Patent: Dec. 11, 1990

[54] SEMICONDUCTOR COOLING APPARATUS

[75] Inventors: Tadakatsu Nakajima; Heikichi Kuwahara; Shigeo Ohashi; Motohiro Satoh; Toshihiro Yamada, all of Ibaraki; Kenichi Kasai, Ushiku; Satomi Kobayashi, Nagareyama; Akihide Watanabe, Tsukuba, all of Japan

[73] Assignee: Hitachi, Ltd., Tokyo, Japan

[21] Appl. No.: 261,639

[22] Filed: Oct. 24, 1988

[30] Foreign Application Priority Data

Oct. 26, 1987 [JP] Japan .................. 62-268166

[51] Int. Cl.[5] .................. H01L 25/04; H01L 39/02; H01L 23/16
[52] U.S. Cl. .................. 357/82; 357/80; 357/75; 165/80.4; 165/104.33; 361/382
[58] Field of Search ............ 357/82; 165/80.4, 104.33; 361/382

[56] References Cited

U.S. PATENT DOCUMENTS

| 3,703,668 | 11/1972 | Bylund et al. | 317/234 R |
|---|---|---|---|
| 4,129,881 | 12/1978 | Reichel et al. | 357/82 |
| 4,644,385 | 2/1987 | Nakanishi et al. | 357/82 |
| 4,686,606 | 8/1987 | Yamada et al. | 361/385 |
| 4,740,866 | 4/1988 | Kajiwara et al. | 361/382 |

FOREIGN PATENT DOCUMENTS

| 2236065 | 9/1987 | European Pat. Off. | 357/82 |
|---|---|---|---|
| 3444173 | 6/1986 | Fed. Rep. of Germany | 357/82 |
| 0200495 | 11/1984 | Japan . | |
| 0094749 | 5/1985 | Japan . | |
| 0160150 | 8/1985 | Japan . | |
| 0032449 | 2/1986 | Japan . | |
| 0228651 | 9/1988 | Japan | 357/82 |
| 0233557 | 9/1988 | Japan | 357/82 |

OTHER PUBLICATIONS

Integrated Circuit Module Package Cooling Structure IBM Bull., vol. 20, No. 10, Mar. 1978, pp. 3898–3899.

Primary Examiner—Andrew J. James
Assistant Examiner—D. M. Ostrowski
Attorney, Agent, or Firm—Antonelli, Terry, Stout & Kraus

[57] ABSTRACT

Flexible cooling paths are connected to semiconductor elements which are heated members. A cooling apparatus comprises cooling blocks connected to cooling blocks, coolant flow paths through which the coolant flows, coolant branching mechanisms provided in the coolant flow paths and connecting mechanism for connecting the branching mechanism and the cooling blocks through O-rings. A part of coolant flowing through the cooling flow paths is introduced into the cooling blocks for the respective heated chips in order.

19 Claims, 19 Drawing Sheets

F I G. 23
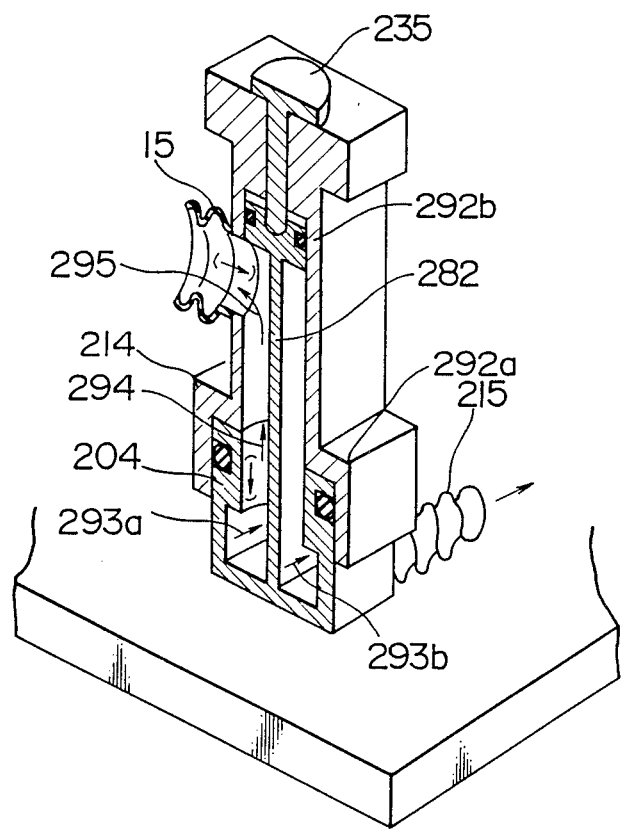

SEMICONDUCTOR COOLING APPARATUS

BACKGROUND OF THE INVENTION

The present invention relates to a semiconductor cooling apparatus in which flexible cooling passageways are brought into contact with heated members of electronic components such as semiconductor elements, and cooling water is caused to flow through the cooling passageways, thereby cooling the heated members.

In a conventional apparatus, as shown in, for example, Japanese Patent Unexamined Publication Nos. 59-200495, 61-32449, and 60-160150 and U.S. Pat. No. 3,703,668, cooling fins are mounted on a back surface of a heated element (for example, a semiconductor chip) and water is caused to flow through the cooling fins to cool the heated member. It is common to mount a plurality of heating chips on a base plate, and to connect wires of the chips to wirings of the base plate according to a flip chip method (soldering balls) so that signals are applied through such wiring arrangement. On the other hand, on the back surface of the heated chip, there are provided inlet and outlet cooling water passageways that are formed of flexible material. The flexible structure is metallically coupled with a cooling water header through an O-ring or soldering. In some cases, two separate cooling water passages one for an inlet and one for an outlet, are provided in a single chip, and in other cases, a double or coaxial passage is provided for the single chip. In any case, such a flexible structure serves to prevent stress due to a shift of the cooling water header from directly affecting the chip as much as possible. The heated chip is cooled through cooling fins by the cooling water flowing through the flexible assembly. The cooling fins and the heating member are metallically coupled with each other or are coupled with each other through high heat conductive material such as silicone oil and grease. In any case, means for enhancing the heat conductivity is provided at this portion.

A semiconductor cooling structure to which the present invention pertains must be used for effectively cooling the heated chips and at the same time to suppress the stress applied to the heated chips as much as possible. Furthermore, since the heating chips are generally small in size (for example, 10 to 20 mm long) and are also arranged in high density, the cooling structure must be assembled or repaired in a limited space. Namely, the structure must have good assembling and repairing characteristics. Moreover, since the coolant is caused to flow through the narrow space, the pressure loss caused by the fluid resistance is likely to be large.

For example, according to one method, two flexible bellows are provided to the cooling structure, and are used as the inlet and outlet for the coolant. In this method, the flexible bellows and cooling blocks for covering the cooling fins on the chip back surface are coupled with each other by soldering, and also the cooling block and the heated chips are coupled with each other by soldering or the like. These flexible bellows are also connected to the cooling block provided on the back surfaces of the adjacent heating chips. It is therefore necessary to disassemble the cooling structure and to remove the heated chips in the case where there is a damaged heating chip even with the soldered cooling structure. In this case, if the respective components are coupled with each other by soldering or the like, the workability is very poor. On the other hand, it has been proposed to connect the flexible bellows and the cooling header, constituting the cooling structure, to each other by using O-rings to thereby enhance the assembling and repairing characteristics. However, in this case, the header of the coolant must be increased and a number of flexible bellows must be interposed between the base plate and the coolant header. It is therefore necessary to mount a number of flexible bellows through the O-rings onto the coolant header upon the assembling work. The cooling block provided at one end of the flexible bellows mounted at the other end to the cooling header is to be mounted on the heated chip. In this case, since it is impossible to connect the cooling block and the heated chip to each other by soldering or the like because of the narrowed space therebetween, it is necessary to, for example, assemble the cooling structure while clamping the heat conductive grease or heat conductive sheet between the cooling block and the heated chip. In this case, when it is necessary to remove the cooling structure due to damage to heated chip, it is possible to separate the structure at the heat conductive grease or heat conductive sheet. However, the cooling method in which the heat conductive grease or the heat conductive sheet is interposed between the cooling block and the heated chip is subjected to a large heat resistance in comparison with a method in which the cooling block and the heated chip are coupled directly to each other by soldering or the like. The indirect coupling method does not meet the requirement of the semiconductor cooling structure where the heating chips must be effectively cooled. Furthermore, due to the flow of the coolant in series in the cooling surfaces of the cooling blocks corresponding to the plurality of heated chips, the flow resistance will be increased in the cooling blocks to increase the pressure loss.

SUMMARY OF THE INVENTION

An object of the invention is to provide a semiconductor cooling apparatus which is capable of reducing the flow resistance of the coolant and the heat resistance also in view of the assembling characteristics and the repairability.

According to a first aspect of the present invention, the above-described object is attained by providing a semiconductor cooling apparatus which is composed of a cooling block, a semiconductor package and a coolant supplying block, in which the cooling block and the coolant supplying block are coupled with each other through a coolant passage, and the cooling block and the coolant supplying block are detachably assembled.

According to a second aspect of the invention, in a semiconductor cooling apparatus in which a cooling block is disposed on a back surface side of a heated chip on a base plate and coolant is caused to flow through the cooling block to cool the heated chip, at least two coolant flow paths are provided in the cooling block, the cooling block and the heating chips are coupled to each other by soldering or the like, and a coupler is provided between each of the coolant paths and the cooling block.

According to a third aspect of the invention, in a semiconductor chip cooling apparatus in which a cooling block is disposed on a back surface side of a heated chip on a base plate, coolant is caused to flow through the cooling block to cool the heated chip, at least two coolant paths are provided in the cooling block, couplers are provided between the coolant paths and the cooling block, each of the cooling paths is defined by a flexible bellows, and an axis of the bellows is substantially in parallel with a surface of the base plate.

According to a fourth aspect of the invention, in a semiconductor cooling apparatus in which a cooling block is disposed on a back surface side of a heated chip on a base plate, and coolant is caused to flow through the cooling block to cool the heated chip, at least two coolant flow paths are provided in the cooling block, the cooling block and the heated chip are coupled to each other by soldering or the like, O-rings are interposed in the coolant flow paths, and a coupler is interposed between the coolant flow paths and the cooling block.

According to a fifth aspect of the invention, in a semiconductor cooling apparatus for cooling respective chips, in which cooling blocks are disposed on back surface sides of a plurality of heated chips on a base plate, coolant is caused to flow through the cooling blocks, a double pipe type cooling path is provided for each heated chip, and the coolant flow paths are arranged in parallel to a surface of the base plate so that the coolant is allowed to flow through the plurality of cooling blocks to cool the associated heated chips.

According to a sixth aspect of the invention, in a semiconductor cooling apparatus for cooling a plurality of heated chips, in which cooling blocks are arranged in contact with back surface sides of the plurality of heated chips arranged on a base plate, and coolant is allowed to flow through the respective cooling blocks, coolant flow paths each defined by a double or coaxial tube structure are provided between respective adjacent heated chips, a coolant branching mechanism is provided on an upper portion of each of the cooling blocks through a connecting passage, the coolant branching mechanism has a double or coaxial structure to form a letter T, inner pipes of the coolant flow paths, inner pipes of the coolant branching mechanism and inner pipes of the connecting passage are coupled to each other, and outer pipes of the coolant flow paths, outer pipes of the coolant branching mechanism and outer pipes of the connecting passages are connected to each other, whereby a part of the coolant flowing through the inner pipes of the coolant flow paths is introduced into the cooling blocks to cool the heated chips, and a part of the heated coolant flows between the inner and outer pipes of the connecting passage and is introduced between the inner and outer pipes of the coolant flow paths.

According to a seventh aspect of the invention, in a semiconductor cooling apparatus for cooling a plurality of heated chips, in which cooling blocks are arranged in contact with a back surface side of each of the plurality of heated chips arranged on a base plate, and coolant is allowed to flow through the respective cooling blocks, two main flow paths are defined by flexible pipes, a coolant branching mechanism is provided at an upper portion of each cooling block, a part of the coolant introduced by the main flow path is branched by the coolant branching mechanism to flow into the cooling block to cool the heated chips and to return back to the coolant branching mechanism to join with the rest of the coolant to flow out of the other main flow pipe.

According to an eighth aspect of the invention a semiconductor cooling apparatus for cooling a plurality of heated chips, in which cooling blocks are arranged on a back surface of each of heated chips and the coolant is allowed to flow through the respective cooling block, two main flow pipes composed of flexible pipes are arranged between two adjacent cooling blocks, a coolant branching mechanism having inside a hollow cylindrical sleeve extending from an upper portion of each cooling block to the heated chip side is provided, a part of the coolant introduced into one main flow pipe is branched by the coolant branching mechanism into the cooling blocks to cool the heated chips and to return back to the main flow pipe, so that a part of the fluid is joined with the rest of the coolant flowing through slits formed close to the main flow pipe of the cylindrical sleeve to flow out of the other main flow pipe.

The following features (i) to (v) are suitable for the sixth aspect of the invention:

(i) The outer tubes of the coolant flow path should be made of an elastic or flexible pipe such as a bellows and the inner tubes of the connecting path should be made of an elastic or flexible pipe, such as a rubber nose, for the purpose of suppressing or moderating the stress.

(ii) The flexible bellows is coupled at opposite ends to the cooling fluid mechanism by brazing or the like. A flexible rubber hose is inserted at opposite ends into the coolant branching mechanism and the inner pipe of the connecting passage, respectively. The outer pipe of the coolant branching mechanism is connected to the outer pipe of the connecting passage through an O-ring. An O-ring fastening mechanism is provided outside the piping system.

(iii) Fin rows are provided on a surface of the cooling block confronted with the heating chips. A fin pressure plate is provided at one end of the connecting passage inner pipe to cover the end portions of the fins so that the coolant introduced from the inner pipe of the connecting passage into the cooling block is allowed to flow between the fin rows.

(iv) When the cooling block and the connecting passages are arranged, the cooling block and the connecting passage should be located within the outer periphery of the chips so as to define a free space above the base plate between the adjacent heated chips.

(v) In a plurality of coolant flow paths and coolant branching mechanisms arranged alternately, a water feed main pipe is connected to one end of the inner pipe of the coolant flow path, a water discharge main pipe is connected on the other side to the outer pipe of the coolant flow path, the outer and inner pipes of the coolant flow path are closed on one end, and an end of the coolant flow path is closed on the other end, so that the coolant introduced into the water feed main pipe is introduced into the cooling block on a back surface of each heated chip and the coolant flowing out of the cooling block is introduced into the water discharge main pipe. The flow paths for the coolant are arranged in parallel in each cooling block.

The following features (iv) to (xi) are suitable for the seventh aspect of the present invention:

A main flow pipe is composed of a flexible pipe, such as a bellows. The flexible pipe is arranged substantially in parallel with the base plate surface Both of the ends of the main flow pipe are connected to the coolant branching mechanism by brazing or the like.

A branching plate provided with a hole is inserted into the coolant branching mechanism. A part of the coolant introduced from the flexible pipe is branched by the branching plate to flow on the cooling block side. The other part of the coolant flows through the opening and thereafter is merged with the part of the coolant which returns from the cooling block side to flow to another flexible pipe.

(viii) An O-ring for sealing the cooling block and the coolant branching mechanism in a circumferential direction is applied to the connecting structure. An O-ring fastening mechanism is constructed so that the coolant branching mechanism is pressed against the cooling block through a branching plate by bolts or the like.

(ix) The flexible bellows for forming the main flow pipe is in the form of a cylinder.

(x) The flexible bellows forming the main flow pipe is in the form of an ellipse in cross section with its short diameter being substantially parallel with the base plate surface.

(xi) A series structure is composed of a plurality of cooling blocks and a plurality of coolant branching mechanisms that are coupled with flexible structures. The respective cooling blocks are connected to a plurality of heated chips by soldering. Coolant curved pipes corresponding to the series structure fixed to the base plate are provided to both sides of the series structure. Furthermore, a main pipe is provided along the coolant curved pipes. The coolant branching mechanisms at both ends of the series structure are connected to the coolant curved pipes through the flexible structures. The respective coolant curved pipes are connected to the main flow pipe through the flexible structures.

The following features (xii) to (xiii) are suitable for the eighth aspect of the invention:

(xii) The flexible pipe is arranged substantially horizontally, and both ends are connected to the coolant pipe by brazing.

(xiii) An O-ring for sealing circumferentially the cooling block and the cooling pipe is provided. An O-ring fastening mechanism is constructed so that the cooling pipe is depressed against the cooling block through bolts or the like.

(xiv) The flexible pipe is made of a shift absorbing mechanism, such as a bellows, and a flexible or elastic member, such as rubber.

(xv) A series structure is composed of coolant pipes and cooling blocks connected to the flexible pipes. The respective cooling blocks are connected to a plurality of heated chips by soldering. Coolant main pipes corresponding to the series structure fixed to the base plate are provided on both ends of the series structure. The coolant pipes and the coolant main pipes on both ends of the series structure are connected to each other through the flexible structures.

(xvi) An area of a slit formed in each coolant branching mechanism composed of a hollow sleeve provided inside of each cooling block and forming the series structures is kept at minimum at a the cooling block closest to the coolant main pipe on the coolant supply side, and an area of a slit formed in each coolant branching mechanism composed of a hollow sleeve on the coolant discharge side is kept at a maximum, areas of a series of cooling blocks being changed in order.

(xvii) A slit formed in the coolant branching mechanism composed of a hollow sleeve provided inside of the cooling block forming the series structures is located away from the contact surface between the cooling block and the heated chip in the cooling block close to the coolant main pipe on the coolant supply side, and a slit formed in the coolant branching mechanism composed of a hollow sleeve provided inside of the cooling block forming the series structures is located close to the contact surface between the cooling block and the heated chip close to the cooling block, the positions of the slits of the cooling blocks disposed therebetween being changed in order.

With such a structure, it is not necessary to remove all of the module during chip maintenance. It is sufficient to remove only the necessary blocks for the block to be removed.

Also, it is possible to inspect the chips without removing the cooling blocks during the logic inspection of the chips.

On the other hand, during the manufacture of the shield structure including the cooling blocks, a reflow step for chip soldering as well as the base plate, chips and cooling blocks must be performed, so that the thermal stress applied to the chips is large. However, according to the present invention, the cooling blocks are independent of the chips so that such thermal stress may be avoided.

BRIEF DESCRIPTION OF THE DRAWINGS

In the accompanying drawings:

FIG. 23 is a cross-sectional view showing the structure of the coolant header pipe shown in FIG. 21;

DETAILED DESCRIPTION OF THE INVENTION

Figure 1:
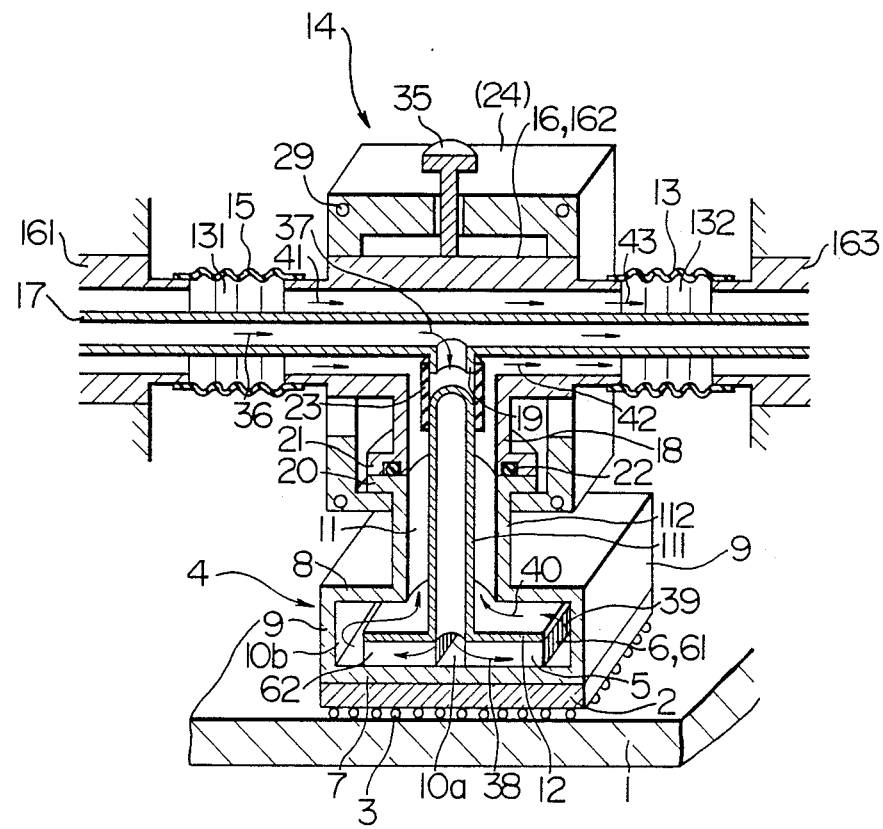
FIG. 1 is a partial cross-sectional and perspective view showing a unit of a semiconductor cooling apparatus in accordance with the present invention.

The present invention will now be described with reference to the accompanying drawings.

Typical aspects of the present invention will now be described. Cooling blocks having cooling fins are metallically connected to heated chips by soldering. Each cooling block is connected through an O-ring to a coolant flow path so that the cooling block may be detached from the coolant flow path. The O-ring may be tightened from the outside (opposite to the chip and the base plate) by means of a screw mechanism or the like.

If inlet and outlet ports for the coolant are separately formed in the cooling block, it is impossible to seal the cooling block by using the O-ring or the like. Therefore, the inlet and outlet ports are of the double tube type. For example, the coolant is introduced from the inlet port into the cooling block, and is discharged from the cooling block through the outlet port. Therefore, the sealing mechanism such as an O-ring is provided on the outer flow path, that is, the outlet port. Flanges are formed at an end of the outer flow path of the cooling block and an end of the coolant flow path and the O-ring is interposed between the contact surfaces of the flanges. The fastening mechanism for the flanges is constructed so that the flanges are pressed against each other by pressing half jigs using a bolt or the like. If a coolant header is used, it is impossible to provide the O-ring fastening mechanism. Cooling units on a plurality of heated chips are connected to each other through the coolant flow paths which are of the double tube structure. The outer flow path structure of the double tube type is made of flexible bellows. In the inner flow path structure, the inside of the cooling block is connected to the coolant flow path through a rubber hose or the like.

(ii) In addition to the structure described in the above paragraph (i), the coolant is allowed to flow through the cooling blocks on back surfaces of the respective heated chips in series mounted on the base plate. Main flow paths for the coolant for connecting in series the respective cooling blocks are made of flexible bellows or the like. The flexible structures are arranged in parallel with the base plate. In the main flow paths, the coolant branching mechanisms are provided corresponding to the cooling block, so that a part that has been introduced into the main flow paths is allowed to flow into the cooling blocks and to return back to the main flow path while emerging with the rest of the coolant.

In the semiconductor cooling structure, it is necessary that the stress to the heated chips be suppressed as much as possible and the cooling chips be effectively cooled with good assembling characteristics of the cooling structure and good repair characteristics.

The effect during the cooling operation with the structure (i) will be explained. The coolant flowing through, for example, the inner flow path of the coolant flow path of the double tube type is branched within the cooling unit and is introduced through the rubber hose connecting the inner flow path of the coolant flow path and the inner flow path of the cooling block. The cooling fins are mounted on a back surface side of the chip within the cooling block. The coolant is caused to flow through the fins while cooling the fins but the coolant itself is heated. Subsequently, the coolant is allowed to flow through the outer flow path of the double tube of the cooling block and is discharged from the cooling block. Then, the coolant also flows through the outer flow path of the coolant flow path of the double tube type to flow through the flexible bellows and to be introduced into the cooling block on the back surface of the heated chip. When the coolant passes through the cooling fins of the cooling block, the coolant cools the heated chip through the cooling fins and the soldering layer between the cooling block and the heated chips. Thus, it is possible to keep a number of semiconductors arranged within the heated chip at a low temperature.

On the other hand, in operation, the temperature of the semiconductors is kept at, for example, 60 to 120° C. It is general that the temperature of the coolant is at about 20° C. Therefore, the cooling apparatus assembled at room temperature has a temperature gradient in operation. Due to the difference in material forming the respective elements of the cooling apparatus and the difference in temperature, the expansion rates of the respective elements of the cooling apparatus are different from each other. There is a thermal stress in operation so that the stress is applied to the heated chip. The heated chip and the base plate are connected to each other through soldering balls. This connection is mechanically weak. If the stress would be applied to the chip, the soldering balls would be damaged Therefore, in order to moderate the stress, it is necessary to use the flexible cooling structure. In particular, it is necessary to connect the chip within the cooling structure and the coolant flow path by using the flexible structure in order to absorb the thermal deformation. At this portion, there would be a remarkable temperature gradient. According to the present invention, the rubber hose in the inner flow path and the bellows in the outer flow path are used to form the flexible structures.

The assembling property will be explained. First of all, the cooling block having the cooling fins is connected to the heated chip by soldering or the like. Subsequently, the inner flow structure of the coolant flow path and the inner flow path structure of the cooling block are connected to each other by a rubber hose. At the same time, an O-ring or the like is interposed between the flange formed at the end of the outer flow path structure of the coolant flow path and the flange formed at the end of the outer flow path structure of the cooling block. Subsequently, the coolant flow path structure is supported on both sides by half jigs. The coolant flow path structure is supported by bolts or the like through the jig to produce the fastening force to the flanges to fasten the O-ring.

In repairing, it is possible to separate the cooling block and the coolant flow path by loosening the bolt.

Subsequently, the cooling operation the structure as set forth in the paragraph (ii) (corresponding to the six and seventh aspects of the invention) will be explained. The main flow pipe through which the coolant such as water, flows is made of flexible bellows and is arranged in parallel with the base plate. In order to supply the coolant to a plurality of heated chips arranged on the base plate, the coolant branching mechanisms are arranged in the main flow pipes in correspondence with the respective cooling blocks. The coolant branching mechanisms and the cooling blocks are connected to each other through the coolant connecting passages. Therefore, the coolant that flows through the main flow pipes is branched partially by the coolant branching mechanism. The part is introduced into the cooling blocks. The cooling fins are arranged in parallel in surfaces of the cooling blocks contacted with the heated chips. The coolant is allowed to flow between the fins. At this time, the coolant will remove the heat, emitted from the heated chips, through the fins while the coolant itself is heated. The heated coolant is returned back to the coolant branching mechanisms within the main flow pipe through the coolant connecting passages. The coolant is merged into the rest of the coolant that has not been branched. It is thus possible to keep of the semiconductor elements at a low temperature. All the coolant within the main flow pipe flows to the respective cooling blocks but a minimum necessary amount of the coolant flows through the narrow paths of the fins of the cooling blocks. Thus, it is possible to suppress the flow resistance and the pressure loss.

Subsequently, the assembling property will be explained. First, the cooling block having the cooling fins is connected to the heated chip by soldering or the like. On the other hand, a branching pipe is connected to a portion corresponding to each heated chip A branching plate is inserted into the branching pipe. Each branching pipe and the cooling pipe mounted on each cooling block are assembled with the O-ring. Then, in order to fix the branching plate, the branching plate is pressed by bolts or the like from above the main flow pipe (opposite to the branching pipe). The branching plate extends from the main flow pipe to the cooling fins of the cooling block. An opening through which the non-branched coolant flows is formed in the main flow pipe. The branching plate is disposed to branch the paths at the branching pipe portion and the cooling pipe portion, respectively, to form the flow paths toward the cooling block and from the cooling block toward the main flow pipe.

The cooling operation corresponding to the structure according to eighth aspect of the invention will now be described. The main flow pipe through which the coolant such as water flows is made of flexible bellows or the like and is arranged in parallel with the base plate. The coolant branching mechanisms made of pipe structures for supplying the heated members of the cooling block with the coolant are provided within the cooling blocks corresponding to the plurality of cooling chips on the base plate and connected to the coolant pipes. The cooling liquid branching mechanism and the cooling block are coupled in unison with each other. Therefore, the coolant flowing the main flow pipe is partially branched by the coolant branching mechanism made of pipes and is introduced to the heated chip. In the surface of the cooling block contacted with the heated chip, the cooling fins are arranged in parallel or radially so that the coolant flows through the fins. At this time, the coolant removes the heat, emitted from the heated chip, through the fins and coolant itself is heated. Heated coolant passes through a space between a pipe for branching the coolant and a coolant pipe connected to the cooling block and is again returned back to the vicinity of the joint portion between the coolant pipe and the main flow pipe. The medium is not branched but is emerged with the coolant passing through an orifice formed in the pipe. Thus, it is possible to keep a number of semiconductors, arranged in the chip at a low temperature. All the coolant within the main flow pipe is not flowed to the respective cooling block, but a minimum flow amount of the coolant is allowed to enter the narrow spaces of the fin rows within the cooling blocks. The flow resistance and pressure loss are suppressed.

The operation is the same as that in case of the sixth and seventh aspects of the invention (paragraph (ii)).

The assembling property will now be described. First, the cooling block having the coolant branching mechanism composed of cooling fins and pipe is connected to the heated by soldering or the like. On the other hand, the coolant piping is connected to the portion of the main flow pipe corresponding to each heated chips. Each coolant pipe and each cooling block are assembled together through the O-ring. The upper portion of the coolant pipe (opposite to the chip) and the upper portion of the cooling block (opposite to the chip) are fixed together by a bolt or the like. An opening is formed in a pipe connected to the cooling block for passing the non-branched coolant in the main flow pipe. The coolant that has flowed through the main flow pipe is introduced into the pipe. Thereafter, the flow path is branched to the flow path toward the fins of the cooling block and a flow path toward the main flow path through the opening formed in the pipe.

Figure 2:
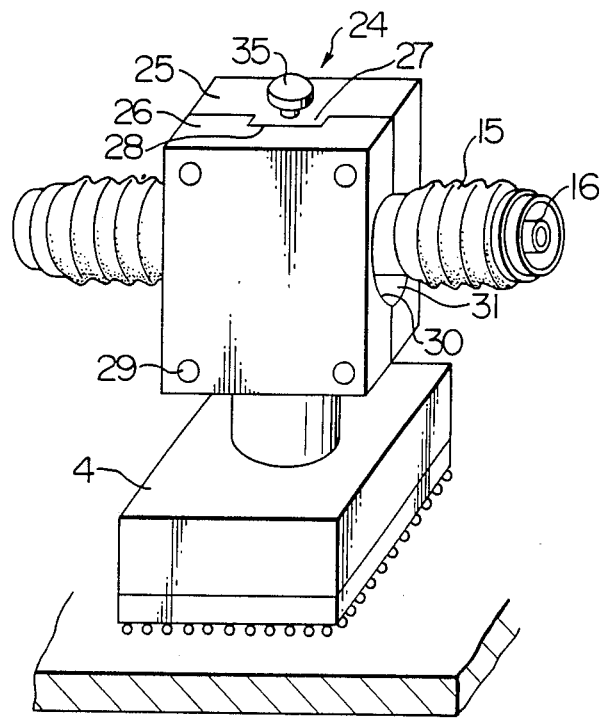
FIG. 2 is a perspective view showing the unit shown in FIG. 1.
Figure 3:
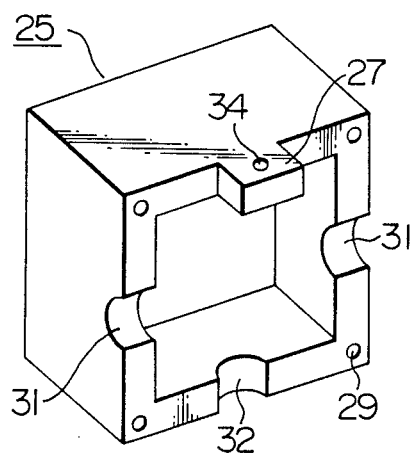
FIGS. 3 and 4 are perspective views showing parts to which the invention partains.
Figure 4:
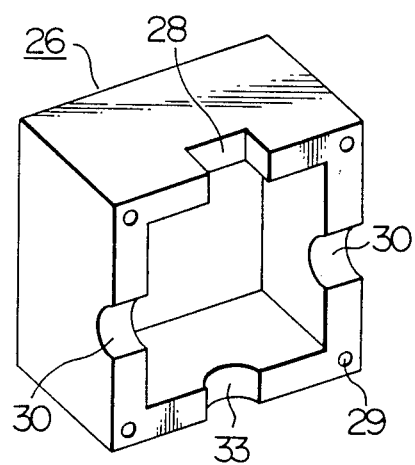

An embodiment of the invention will now be described with reference to FIGS. 1 to 4. FIG. 1 is a partial cross-sectional and perspective view showing a unit structure of a semiconductor cooling apparatus. FIG. 2 is an external perspective view. FIGS. 3 and 4 are perspective views showing parts of FIG. 1. A number of heated chips 2 (FIGS. 1 and 2 show only one) are provided on a wiring base plate 1. Signal wires between the wiring base plate 1 and the heating chip 2 are connected by soldering balls 3. A cooling block 4 is arranged on the back surface side of the heated chip (opposite side to the surface connected with the soldering balls 3), so as to cool the heated chip 2 to suppress temperatures of semiconductor elements within the chip to a constant temperature. A cooling block 4 is in the form of a cube or any other box shape. The cooling block 4 is coupled so as to prevent the coolant from leaking therefrom when the coolant flows through the cooling block 4. The size of the cooling box is substantially the same as the heated chip. Fin rows 6 each composed of a number of fins each of which has an elongated rectangular shape in cross section and which fins are arranged in parallel are connected to a surface 7 on the heated chip side within the cooling block 4. A baffle plate 12 is disposed on the opposite side to the contact surface to press the fin rows as a whole. Fin rows 6 are divided into two blocks 61 and 62. Flow paths 10a and 10b where there are no fins are formed in the central portion and end portions of the cooling block 4. A connecting passage 11 for the coolant is formed above the central upper portion of the cooling block 4. The connecting passage 11 is of the double or coaxial pipe type and is composed of an inner pipe 111 and an outer pipe 112. The outer pipe 112 is connected to an upper cover 8 of the cooling block 4 so that the coolant may be introduced and discharged between the outer pipe and the cooling block interior. The inner pipe 111 is extended beyond the end of the outer pipe 112 to the interior of the cooling block 4 and is connected to the central portion of the baffle plate 12, whereby the coolant may be introduced and discharged between the inner pipe 111 and the passage 10a defined by the fins 61 and 62. At the other end of the connecting passage 11, there are provided a coolant passage 13 for introducing the coolant to the respective heated chips and a coolant branching mechanism 14 for branching the coolant to the connecting passage 11 above the back surface of each heated chip. The passage of the coolant branching mechanism 14 is T-shaped. Coolant flow passages 131 and 132 are arranged on the right and left sides (FIGS. 1 and 2) of the coolant branching mechanism 14. The connecting passage 11 is arranged under the coolant branching mechanism 14 (FIGS. 1 and 2). Also, the coolant passage 13 and the coolant branching mechanism 14 are of the double pipe type with respect to the flow of the coolant as well as the connecting passage 11. These passage components are composed of inner and outer pipes. Outer communication pipes 16 are connected to the right and left coolant passage 131 and 132 of the coolant branching mechanism 14. An inner communication pipe 17 is arranged to pass through the outer communication pipe 16 and the coolant flow outer pipe 15. The communication outer pipe 16 and the communication inner pipe 17 are branched into the connecting passage 11 within the coolant branching mechanism 14 and are connected with branching outer pipe 18 and branching inner pipe 19. An end, on the coolant branching mechanism 14 side, of the cooling block outer pipe 112 and an end of the branching outer pipe 18 are provided with flanges 20 and 21, respectively, and are sealed by an O-ring 22 (whose O-ring fastening mechanism will be described later). On the other hand, the inner pipe 111 of the cooling block 4 is projected beyond the outer pipe 112 toward the coolant branching mechanism 14. The branching inner pipe 19 and the inner pipe 111 are connected to each other with a rubber hose 23. Further, the connecting outer pipe 16 (connecting outer pipes 161, 162, 163, . . . corresponding to the respective heated chips) is connected at both ends to flexible bellows that forms a coolant flow path 13. Each end of the coolant flow path 13 is connected to the communication outer pipe 16 by brazing or the like.

The mechanism 24 for fastening the O-ring 22 will now be explained. As shown in FIG. 2, the mechanism 24 is in the form of a box or a cubic box. As shown in FIGS. 2 to 4, the mechanism 24 is composed of two halves 25 and 26 for encasing therein the coolant branching mechanism. At the coupling surface between the half boxes 25 and 26, on one hand, a convex portion 27 is formed in the central portion of the half box 25 and on the other hand, an associated concave portion 28 is formed in the central portion of the half box 26. With such a structure, it is possible to well align or couple the box halves. Semicircular shaped recesses 30 and 31 are formed in the two facing surfaces of the box halves 25 and 26 so that the communication outer pipes 16 and the coolant flow path outer pipes 15 may be inserted into the holes defined by the semicircular recesses 30 and 31 when the box halves 25 and 26 are coupled with each other. Semicircular recesses 32 and 33 are formed in the opposite surfaces to the surfaces having the convex and concave portions 27 and 28 in the box halves 25 and 26, so that the outer pipe 112 may be inserted into the hole defined by the recesses and the hole may support the flange 20. Holes 29 are formed at four corners of each box half so that, when the box halves 25 and 26 are coupled with each other, the halves 25 and 26 are fastened by bolts or the like. Furthermore, a screw hole 34 is formed in the middle of the convex portion 27 of the box half 25 and may be subjected to a bolt 35. When the bolt 35 is threadedly inserted into the hole 34, the bolt 35 is located substantially on a pipe axis of the communication outer pipes.

The flow direction of the coolant such as water will now be described. The flow direction is indicated by arrows in FIG. 1. In FIG. 1, for instance, the coolant introduced from the left side into the interior of the communication inner pipe 17 (arrow 36) is partially allowed to flow into the inner pipe 111 of the connecting passage 11 to be introduced into the space 10a of the cooling block 4 and to flow through the passages defined by the blocks 61 and 62 of the fin row 6 (arrow 38). The coolant which has been introduced into the space 10 is allowed to reflect back to the central portion of the cooling block between the baffle plate 12 and the cooling block upper cover 8 as indicated by arrow 39. The coolant is introduced between the inner pipe 111 of the connecting passage 11 and the outer pipe 112 thereof as indicated by arrow 40. The coolant flowing between the branching outer pipe 18 and the branching inner pipe 19 is joined (arrow 42) with the coolant that flows from the left in FIG. 1 (arrow 41) between the communication inner pipe 17 and the communication outer pipe 16. The coolant is allowed to flow toward the right in FIG. 1 between the communication inner pipe 17 and the communication outer pipes 15 and 16 (arrow 43). The coolant is caused to flow between the fins of the blocks 61 and 62 of the fin rows 6 as indicated by the arrow 38 to cool the heated chip through the fins 5 and the surface 7 so that the coolant itself is heated. The foregoing description is concerned with the case where the coolant is introduced from the inner pipe side and is discharged through the outer pipe side. It is apparent for those skilled in the art that, inversely, the coolant may be introduced from the outer pipe and may be discharged from the inner pipe. As described above, according to this embodiment, all the coolant is not caused to flow into the cooling block 4 corresponding to each heated chip, but the branching mechanism is interposed in the flow path of the coolant to allow the necessary amount of the coolant to flow into each cooling block 4.

An assembling method o the present invention will now be described. First of all, the assemblies each composed of the cooling block 4 and the connecting passage 11 connected integrally with each other are connected through the soldering balls 3 to a plurality of heated chips 2 on the base plate 1. Each of the communication outer pipes 16 and each of the coolant flow path outer pipes 15 are coupled by, for example, brazing. The inner pipes 17 are inserted into the outer pipes. Subsequently, the O-rings 22 are interposed between the flanges 20 and 21 of the respective communication outer pipes 112 and the respective branching outer pipes 81. In this case, the rubber hose 23 is provided between each communication inner pipe 111 and each branching inner pipe 19. The box halves 25 and 26 are coupled with their convex portion 27 and concave portion 26 being engaged with each other so as to cover the communication outer pipe 16. The bolts 29 are threadedly inserted at the four corners to fasten the box halves 25 and 26. Subsequently, the bolt 35 is inserted into the screw hole 34 in the convex portion 27 so that the tip end of the bolt 35 is brought into contact with the outer surface of the communication outer pipe 16. Furthermore, the bolt 35 is fastened so that the surface of the box halves 25 and 26 where the recesses 32 and 33 are formed presses the flange 20. As a result the O-ring 22 is fastened to seal the coolant.

Effects of the embodiment of the invention will now be described. The stress moderating mechanism is formed by the rubber hose 23 and the flexible bellows 15. In the operation of the apparatus, since the chip 2 is heated, the heated chip 2 and the base plate 1 are kept at a relatively high temperature. The cooling block 4 and the coolant branching mechanism 14 through which the coolant is allowed to flow are kept at a relatively low temperature. Therefore, in the apparatus which is assembled at room temperature, in operation, there is a temperature gradient so that the structure is subjected to the thermal deformation. However, in the apparatus, since the inner pipes are connected in mid way with the rubber hose 23 and the outer pipes are connected with the flexible bellows 15, it is possible to absorb the thermal deformation with the rubber hose and the flexible bellows.

In the foregoing embodiment, all the coolant is not caused to flow through the cooling block corresponding to each heated chip but only a necessary amount of the coolant is caused to flow into each cooling block 4 by the branching mechanism. Therefore, the coolant flows in relatively narrow flow paths. It is possible to suppress the flow rate and the pressure loss to a minimum level.

According to the embodiment, since the cooling block and the heated chip are connected to each other by soldering or the like, the heat emitted from the heated chip may be absorbed rapidly toward the cooling block. Furthermore, the cooling fin rows 6 are provided on the connection surface 7 of the cooling block and the fin rows 6 are pressed by the baffle plate 12, the coolant may flow through a space between the adjacent fins 5, thereby improving the cooling performance of the fins 5. For this reason, finally, it is possible to transmit the heat emitted from the heated chip to the coolant with a high efficiency.

In the embodiment, the cooling block 4 is connected to the heated chip 2 by soldering or the like. Thereafter, the coolant passages are formed by the O-ring 22 and rubber hose 23. Therefore, the structure is superior in assembling property.

In the case where the heated chip is damaged for any reason, it is necessary to remove the cooling apparatus. In this case, it is possible to remove the cooling apparatus by loosening the four bolts 29 of the box halves 25 and 26 an the bolt 35 located in the outermost portion to remove the fastening mechanism 24. Furthermore, as a result, the seal of the O-ring is loosened, so that is easy to remove the coolant branching mechanism 14 and the coolant flow pipe 13.

Figure 5:
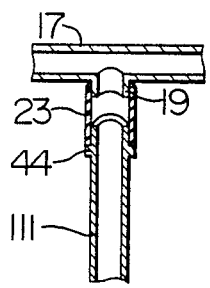
FIG. 5 is a cross-sectional view showing a modification in structure of the branching mechanism according to the invention.

FIG. 5 shows a modification of the foregoing embodiment in the branching pipe structure. FIG. 5 is directed to the improvement of the mechanism for connecting the branching inner pipe 19 and the inner pipe 111 by means of the rubber hose 23. A rib 44 is provided at an outer peripheral surface of the inner pipe 111. The rubber hose 23 is pressed by the rib 44, so that it is easy to fix the rubber hose 23.

Figure 6:
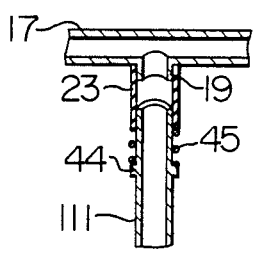
FIG. 6 is a cross-sectional view showing a similar modification in structure of the branching mechanism according to the invention.
Figure 7:
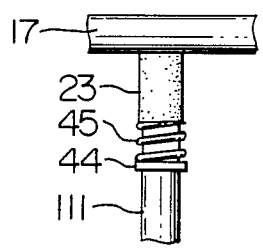
FIG. 7 is a side elevational view of the part shown in FIG. 6.

FIG. 6 shows a modification of the branching mechanism. FIG. 7 is an outer view of the mechanism shown in FIG. 6. In FIG. 6, a spring 45 is provided between the rubber hose 23 and the rib 44. Even after the assembling, the rubber hose 23 is normally urged to the branching inner pipe 19.

Figure 8:
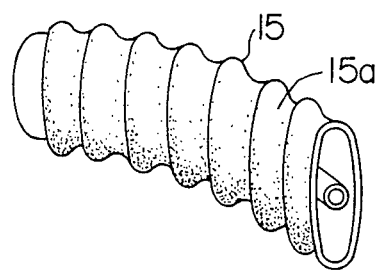
FIGS. 8 and 9 are perspective views showing the bellows according to an embodiment of the invention.
Figure 9:
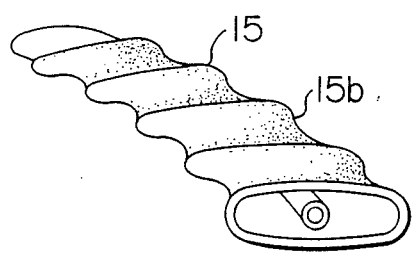

FIGS. 8 and 9 show the vicinity of the bellows according to the embodiment of the invention. The flexible bellows 15 (coolant outer flow pipe) is in the form of an ellipse in cross section. The bellows 15 is arranged so that a long diameter of the ellipse thereof is perpendicular to the base plate 1. This structure enjoys the following advantages. As described above, in the cooling apparatus in accordance with the foregoing embodiment, in the operation, the heating chip 2 and the base plate 1 are kept at a relatively high temperature, and the coolant branching mechanism 14 and the coolant flow path 13 through which the coolant flows are kept at a relatively low temperature. Therefore, the extents of the expansion of the respective elements are different from each other according to the temperature difference and the material difference between the high temperature side and the low temperature side. As a result, a thermal stress is generated in the structure. In accordance with the embodiment of the invention, since the coolant branching mechanism 14 is connected to the flexible bellows, it is possible to prevent the thermal deformation due to the elongation of the bellows 15 to thereby moderate the thermal stress generated in the structure. In the elongation of the bellows, it is relatively easy to moderate the stress in the axial direction of the bellows. In the elliptical bellows, it is easy to absorb the thermal deformation in a direction perpendicular to the axial direction of the bellows. The elliptical or oblong bellows enjoys the following advantages. The spring constant k of the bellows in the bending direction is small when the bellows is bent in the short diameter direction of the bellows as shown in FIG. 8, but the spring constant k is large when the bellows is bent in the long diameter direction as shown in FIG. 9. In the case where the bellows 15 is arranged with its long diameter being perpendicular to the base plate 1, when the thermal deformation is generated, the bend along the short diameter surface 15a having the small spring constant of the bellows effects the deformation of the bellows in the direction perpendicular to the axial direction, so that the bend suppresses the thermal stress in the direction perpendicular to the bellows axis. Accordingly, it is possible to moderate the thermal stress in the axial direction of the bellows and the direction perpendicular to the axial direction of the bellows.

Figure 10:
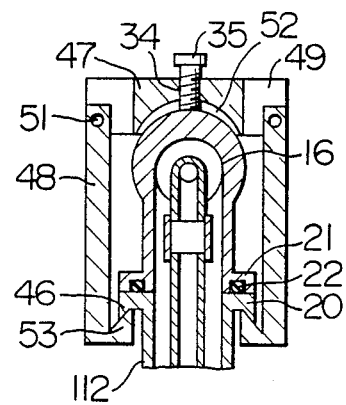
FIG. 10 is a sectional view showing another modification according to the invention.
Figure 11:
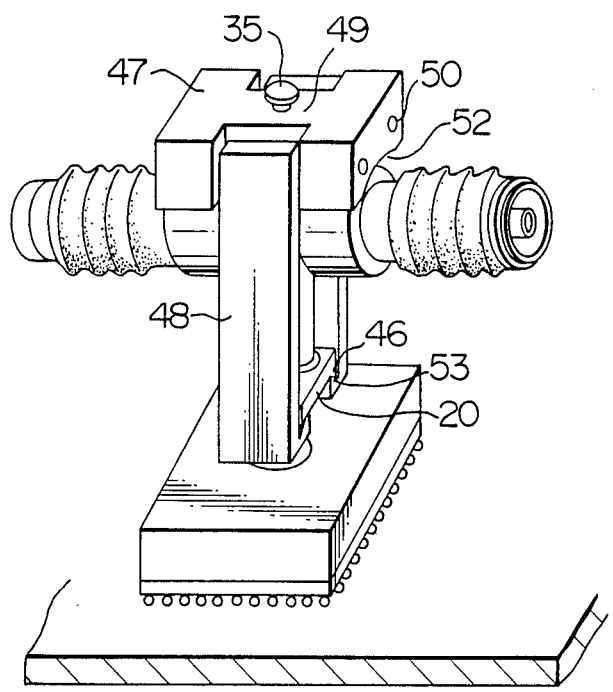
FIG. 11 is a perspective view showing a unit structure of the invention.

FIG. 10 is a cross-sectional view showing another modification of the embodiment of the invention. FIG. 11 is a perspective view of the apparatus shown in FIG. 10. This is an improvement of the O-ring fastening mechanism. The flange at the tip end of the outer pipe 112 of the cooling block 4 is in the form of a rectangular shape. The opposing sides thereof have triangular projections 46 extending toward the cooling block 4. The O-ring fastening mechanism is composed of an I-shaped block 47 and the two suspension members 48. The suspension members 48 are inserted into concave portions 49 of the I-shaped block 47. Fastening rods such as bolts 50 are inserted into holes 51 so that the suspension members 48 are mounted on the block 47. The suspension members 48 may be rotated about the fastening rods 50. A semicircular recess 52 is provided at the portion of the block 47 against which the communication outer pipe 15 contacts. A screw hole 34 is formed in the central portion of the block 47. The suspension members 48 are made of rectangular planar plates. Projections 53 in the form of triangular shapes are formed at the end portion of the suspension members 48 so as to project forwardly. Thus, the projections 53 may engage with the projections 46 provided on the flange 20. The operation of the O-ring fastening mechanism is as follows. First, the semicircular recess 52 of the block 47 is located in the central portion of the communication outer pipe 15 with the two suspension members 48 being opened. Subsequently, the suspension members 48 are closed so that the projections 53 of the suspension member 48 are engaged with the projections 46 of the flange 20. Then, the bolt 35 is inserted into the screw hole 34. When the end of the bolt 35 comes into contact with the communication outer pipe 16, the bolt is further rotated, whereby the force for fastening the branching outer pipe flange 21 and the flange 20 of the communication pipe is generated in the O-ring fastening mechanism to thereby fasten the O-ring 22.

Figure 12:
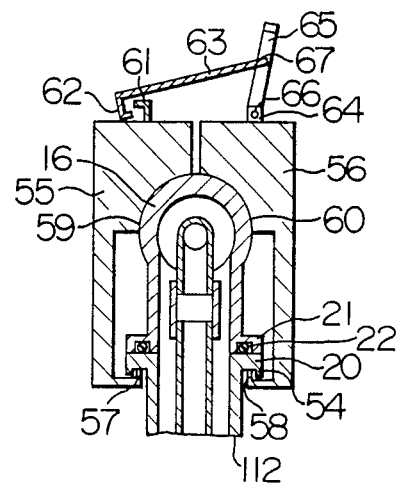
FIG. 12 is a cross-sectional view showing a primary part of another modification according to the invention.
Figure 13:
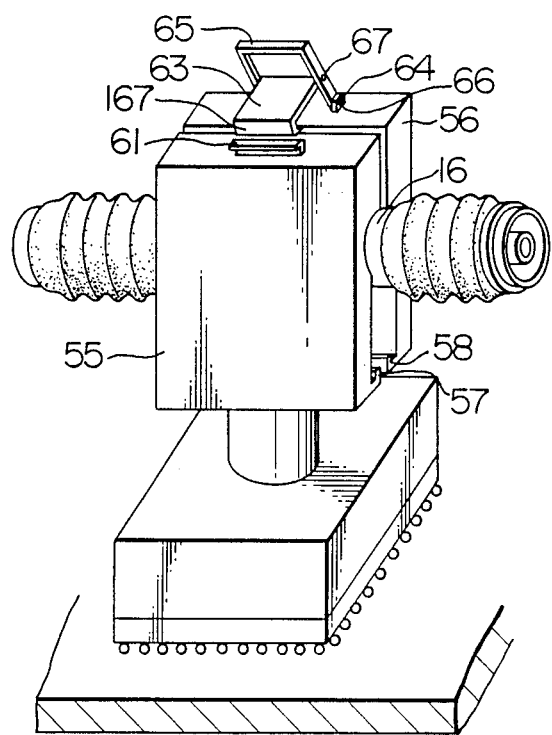
FIG. 13 is a perspective view showing a unit structure in accordance with another modification.

FIG. 12 is a cross-sectional view showing another modification of the invention. FIG. 13 is a perspective view showing a fastening mechanism shown in FIG. 12. A flange 20 at the tip end of the outer pipe 112 of the cooling block is in the form of a rectangular shape. Rectangular projections 54 are provided at the confronting sides of the rectangular flange toward the cooling block 4. The O-ring fastening mechanism is so constructed as to surround the communication outer pipe 16 with the block halves 55 and 56. Rectangular projections 54 extending inwardly are provided at one end of the blocks 55 and 56 so that the projections 54 are engaged with the projections 54 of the flange 20. Circular recesses 59 and 60 are provided so as to fasten the communication outer pipe 16 when the blocks 55 and 56 are coupled with each other. Furthermore, an inverted L-shaped projection 71 is formed at the upper end surface of the block 55. On the other hand, A lock plate 63 having an L-shaped portion 62 is mounted on the upper end face of the block 56 through a retaining portion 64 and a grip 65. The retainer portion 64 and the grip 65, and the grip 65 and the lock plate 63 are coupled to each other through pins 66 and 67, respectively. These components may be pivoted about the respective pins. The operation of the fastening mechanism 24 is as follows. Namely, first, the blocks 55 and 56 are located so that the semicircular recesses 59 and 60 are brought into contact with the outer periphery of the communication outer pipe 16. The projections 57 and 58 at the end side of the blocks 55 and 56 are engaged with the projections 54 of the flange 20 at the end portion of the outer pipe 112. Subsequently, the grip 65 is located on the left side in FIG. 12 and forwardly in FIG. 13, so that the L-shaped projection 61 and the lock 62 of the lock plate 63 are engaged with each other. Subsequently, when the grip 65 is turned to the right in FIG. 12 and rearwardly in FIG. 13, the confronted surfaces of the blocks 55 and 56 are fastened with each other, and at the same time, the relative fastening force is applied to the communication outer pipe 112 and the branching outer pipe 16 to fasten the O-ring 22.

Figure 14:
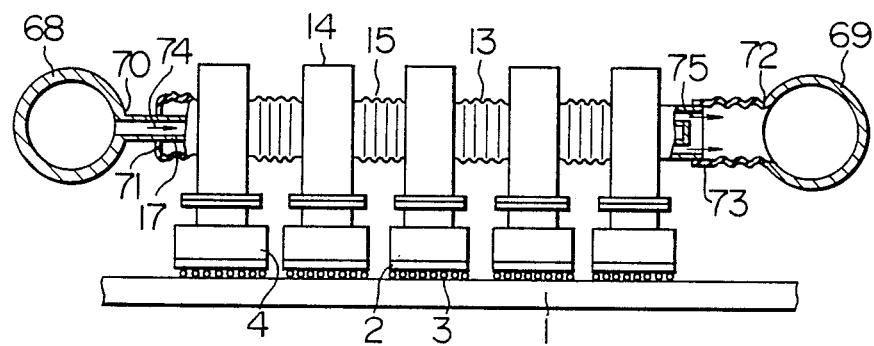
FIG. 14 is a side elevational view showing a semiconductor cooling apparatus composed of a series unit structures according to another modification of the invention.

FIG. 14 shows a plurality of heated chips 2 on the base plate 1 and a plurality of unit structures for cooling the respective chips shown in FIG. 1. In FIG. 14, the coolant is introduced into the feed main pipe 68 disposed on the left side. A discharge pipe 69 is arranged on the right side. Although a single feed pipe 68 is shown in FIG. 14, first ends 70 of the coolant inner pipes (communication inner pipes) 17 are connected to the feed pipe 68. At the first end portion, the inner pipes of the coolant flow path and the outer pipes thereof are connected to each other to form closed portion 71 to prevent the liquid leakage of the coolant. Also, at the right end portion on the right side in FIG. 14, the outer pipes 15 of the coolant flow paths are connected to the discharge main pipe 69 at portions designated by reference numeral 72. In this case, although a single outer pipe 15 is shown in FIG. 14, a number of pipes 15 are actually connected to the right side discharge main pipe 69 as on the left side at 70. At the end portion 72, the end 73 of the inner pipe 17 of the coolant flow path is closed.

The flow of the coolant in such a structure will be explained. The coolant that has been introduced into the feed main pipe 68 is first introduced into a number of inner pipes 17 of the coolant flow paths (as indicated by the arrow 74). The introduced coolant is flows into the respective cooling blocks for the heated chips through the cooling blocks 4 held in contact with the heated chips 2 by the coolant branching mechanisms 14, to thereby cool the respective heated chips and to be heated to be introduced between the inner and outer pipes of the coolant flow paths. The heated coolant is caused to flow in the right direction in FIG. 12 to be gradually emerged and is finally introduced into the right side end portion (as indicated by the arrows 75) into the discharge main pipe 69. Thus, the relatively cold coolant that is flowing through the feed main pipe 68 is introduced into the respective cooling block to cool the respective heated chips. The heated coolant is merged together to be introduced into the discharge main pipe 69. Therefore, the coolant paths are arranged in parallel with respect to the cooling block.

According to the above-described embodiment, since the cooling blocks and the heated chips are connected with each other by soldering or the like, the heat emitted from the heated chips may be effectively transmitted to the coolant that is flowing through the cooling blocks. At the same time, any liquid leak in the flow paths through which the coolant flows may be prevented by the O-ring or the like.

In the foregoing embodiment, the O-ring fastening mechanism is provided opposite to the heated chip or the base plate with respect to the cooling block. Therefore, it is easy to perform the assembling or disassembling work of the coolant branching mechanism and the coolant flow path for supplying the coolant, with respect to the cooling block. In this case, it is unnecessary to remove the soldered connection between the cooling block and the heated chip.

When the semiconductor cooling apparatus is operated, the heated chip is kept at a relatively high temperature, and the portion through which the coolant flows is kept at a relatively low temperature. Thus, the thermal stress or the like is likely to occur, or the stress is likely to be applied to the heated chip due to the assembling precision upon the assembling work. According to the embodiment, the coolant flow path outer pipe 15 is made of flexible bellows, and the branching inner pipe 19 and the inner pipe 111 of the connecting flow path 11 are connected to each other with the rubber hose 23. Therefore, in the embodiment, it is possible to moderate the stress by use of the two flexible pipes. Accordingly, in the embodiment, the stress applied to the heated chip may be decreased. It is possible to prevent a damage of the soldering balls for electric connection between the heated chips and the base plate so as to extend the service life of the chips.

Furthermore, in the embodiment, all the amount of the coolant is not introduced toward the back surfaces of the heated chips, but a necessary amount of the coolant is only allowed to flow toward the respective heated chips. Thus, it is possible to introduce the coolant kept at a relatively low temperature to the respective heated chips. It is therefore possible to cool the heated chips even if the heat quantity emitted from the heated chips would be increased. Also, according to the embodiment, it is sufficient that a relatively small, necessary amount of the coolant is allowed to flow through flow paths having the fine fin rows as in the cooling block. Thus, it is possible to suppress the pressure loss of the fluidization of the coolant.

Figure 15:
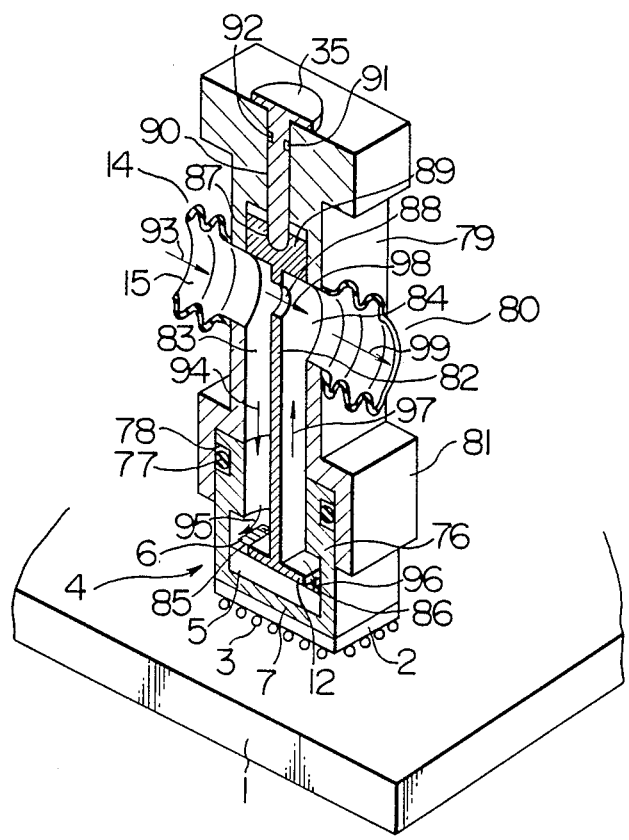
FIG. 15 is a partial cross-sectional view showing a unit in accordance with another modification of the invention.
Figure 16:
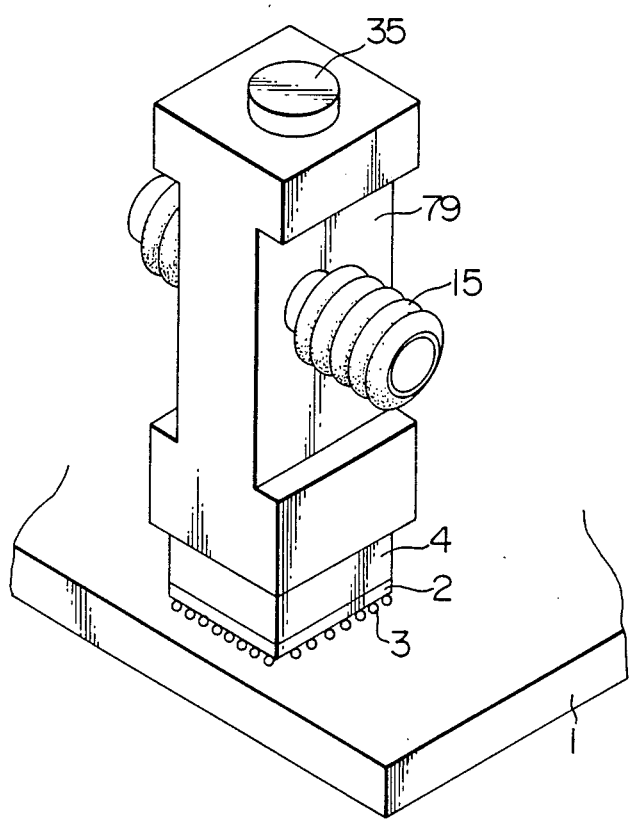
FIG. 16 is a perspective vie showing a unit shown in FIG. 15.

Another modification of the invention will be described with reference to FIGS. 15 and 16. FIG. 15 is a cross-sectional view thereof and FIG. 16 is a perspective view thereof. A number of heated chips 2 (one of which is shown in FIGS. 15 and 16) are mounted on a wiring base plate 1. The signal wires therebetween are connected to each other through soldering balls 3. A cooling block 4 is arranged on a back surface side of the heated chip (which is opposite to the surface connected through the soldering balls 3) to cool the heated chip to maintain the semiconductor elements within the chip at a constant temperature. The cooling block 4 is a cube or a box and is coupled so as to prevent the fluid leakage even when the coolant flows through the block 4. The size of the block 4 is substantially the same as the heated chip. Within the cooling block 4, fin rows 6 composed of a number of parallel fins 5 each having an elongated rectangular cross section are connected to a surface 7 of the heated chip 2. A tubular cooling pipe 76 extends from the surface, opposite to the contact surface, of the cooling block 4. An O-ring groove 78 into which an O-ring 77 is to be inserted is formed in the outer peripheral surface of the cooling pipe 76. Subsequently, the coolant branching mechanism 14 will be explained. The branching pipe 79 is in the form of a rectangular shape. Flexible bellows 15 constituting the main flow pipe 80 are connected to the two opposing surfaces. The cooling block side of the branching pipe 79 is enlarged to form an enlarged part 81. The inner surface of the enlarged portion 81 is in the form of a cylinder. The tubular cooling pipe 76 is inserted into the enlarged portion 81 and is sealed with the O-ring 77. On the other hand, a branching plate 82 is inserted into the central portion of the branching pipe 79. The planar branching plate 82 is used to divide the branching pipe 76 into two halves. The branching plate 82 is arranged to partition the main flow pipe 80 to form two cooling chambers 83 and 84. On the cooling block side of the branching plate 82, a baffle plate 12 is mounted perpendicular to the branching plate 82 to press the fin rows 6 and to be in contact with end portions of the fins 5. With respect to the positional relationship between the fin rows 6 and the baffle plate 12, the baffle plate 12 is arranged so that the flow paths 85 and 86 through which the coolant flows are provided on both the end portions of the fin row 6. An enlarged portion 89 is located on the other end portion of the branching plate 82. A screw hole 87 is formed in the enlarged portion. An opening 88 is formed in the vicinity of the central axis of the main flow pipes 80 located at both ends of the branching pipe 79. The enlarged portion 89 is inserted into the branching pipe 79. Therefore, under the condition where the branching plate 82 is inserted into branching pipe 79, the cooling chambers 83 and 84 are partitioned except for the opening 88 and the fins 5 to thereby prevent the leakage of the coolant. A hole 90 is formed in an upper portion (in FIG. 15) of the branching pipe 79. A bolt 35 having a threaded portion at its end portion is inserted into the hole 90 and is further inserted into the screw hole 87 if the branching plate 82. Then, an O-ring groove 91 into which an O-ring 92 is inserted is formed on a side surface of the bolt 35 to seal the cooling liquid.

The flow direction of the coolant such as water will now be described. The flow direction is shown by arrows in FIG. 15. The coolant that has been introduced from, for example, the left side of the main flow pipe 80 (arrow 93) is introduced into the coolant chamber 83. A part of the coolant is allowed to flow toward the cooling block 4 (arrow 94) and is introduced into the spaces between the fins from the end flow path 85 (arrow 95). The coolant that has flowed through the fins 5 is discharged on the other end flow path 86 of the fin row 6 (arrow 96) and is allowed to flow toward the main flow pipe 80 within the cooling chamber 84 (arrow 97). On the other hand, the rest of the coolant (arrow 93) that has been introduced from the left side of the main flow pipe 80 is introduced into the cooling chamber 84 through the opening 88 formed in the branching plate 82 (arrow 98). The coolant is then emerged with the coolant that is flowing in the direction indicated by the arrows 97 and 98 to flow in the right within the main flow pipe 80 in FIG. 15 (arrow 99). When the coolant has flowed between the fins 5 of the fin row 6, the coolant is used to cool the heated chip 2 through the fins 5 and the surface 7 and the coolant itself is heated. As described above, all the coolant is not caused to flow through each cooling block corresponding to the associated chip, but the necessary amount of the flow is effected to the cooling block with the coolant branching mechanism being formed in the main flow pipe.

An assembling method of the apparatus according to this embodiment will now be described. First of all, the baffle plate 12 of the branching plate 82 and the ends of a part of fins 5 within the cooling block 4 are coupled to each other. A structure composed of the coupled cooling block 4 and cooling pipe portion 76 is connected at a surface 7 o each heated chip 2 mounted on the base plate 1 through the soldering balls 3. In another step, the flexible bellows (coolant flow path outer pipes) 15 are connected to the two confronted surfaces of the branching pipe 79. In this step, a series of structures connected through the flexible bellows between the cooling blocks corresponding to a plurality of heated chips are provided. Subsequently, the O-ring 77 is inserted into the O-ring groove 78 of the cooling portion 76. The enlarged portion 81 of the series structures are assembled with a plurality of cooling portions 76. Subsequently, the O-ring 92 is inserted into the O-ring groove 91 on the side surface of the bolt 35, and the bolt 35 is inserted from the hole 90 with its end being inserted into and fastened to the screw hole 87 of the branching plate 82.

The effect will be explained. It is first noted that the stress moderating mechanism is constituted by the flexible bellows 15. In operation of the apparatus, since the heated chips 2 emit heat, the heated chips 2 and the base plate 1 are kept at a relatively high temperature, whereas the cooling block 4 and the coolant branching mechanism 14 through which the coolant for cooling the heated chips 2 flows are kept at a relatively low temperature. Therefore, in the apparatus that has been assembled at room temperature, there is a temperature gradient in operation so that the structure is subjected to a thermal deformation. However, since each branching pipe 79 is interposed between the flexible bellows 15, it is possible to absorb the thermal deformation by the flexible bellows 15.

In the foregoing apparatus, all the coolant is not allowed to flow through the cooling blocks corresponding to the respective heated chips, but only a necessary amount of coolant will flow through the respective cooling block by means of the branching mechanisms. Therefore, the coolant will flow through narrow or small flow paths. It is possible to suppress the flow rate and the pressure loss in this way.

Also, since the cooling blocks and the heated chips are coupled by soldering or the like, it is possible to rapidly transmit the heat, emitted from the heated chips, to the cooling blocks. Furthermore, since the cooling fin row 6 is provided on the coupling surface 7 of each cooling block 4, and the fin row 6 is retained by the baffle plate 12, the coolant may completely flow through the spaces between the fins 5 to enhance the cooling performance with the fin portion. For this reason, finally, the heat emitted from the heated chips may be effectively transmitted to the coolant.

Further, in the apparatus, since the cooling blocks are coupled to the heated chips by solder or the like, and thereafter, the flow path of the coolant is connected in communication by the O-rings, the assembling property is superior. In the case where the chips are defective due to any reason, it is necessary to remove the cooling apparatus from the chips. In this case, the bolt 35 arranged at the outermost portion is loosened and the coolant branching mechanism 14 may be removed at the O-ring 77 portion.

Figure 17:
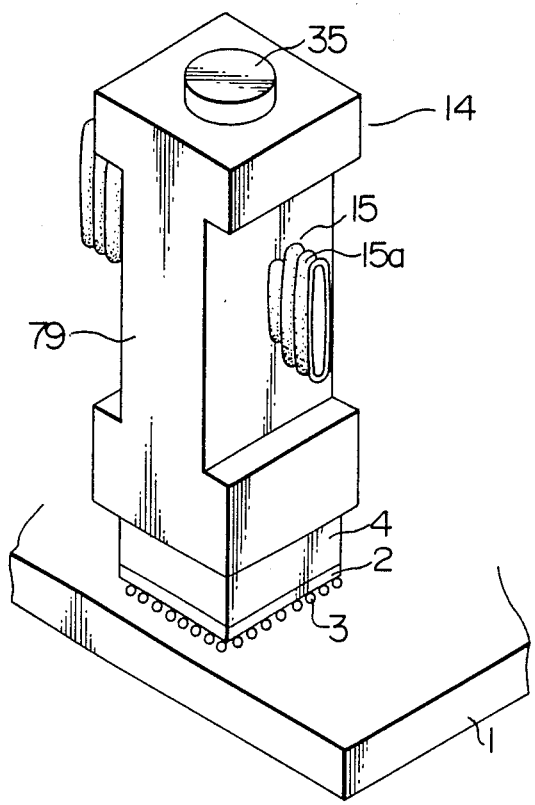
FIG. 17 is a perspective view showing a unit according to another modification.
Figure 18:
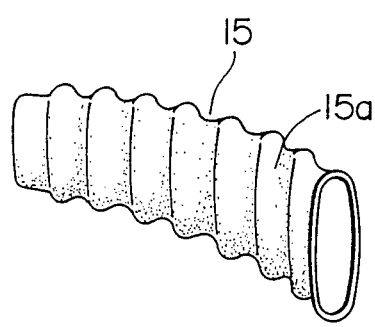
FIGS. 18 and 19 are perspective views showing the bellows in FIG. 17.
Figure 19:
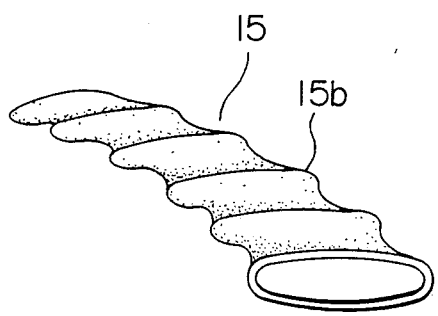

Another modification according to the invention will be explained with reference to FIG. 17 which shows flexible bellows 15 each having an elliptical or oblong section. As shown in FIG. 17, the positional relationship of the oblong bellows is taken so that the direction of the long diameter of the oblong shape is directed perpendicular to the base plate 1. With such an arrangement, the following effect will be ensured. As described above, in operation of the cooling apparatus, the base plate 1 and the heated chips are kept at relatively high temperatures, whereas the coolant branching mechanisms 14 and the main flow pipes 15 through which the coolant flows are kept at relatively low temperature. Therefore, due to the temperature difference between the high temperature side and the low temperature side and the difference in material, there is a difference in expansion extent. As a result, the structure is subjected to the thermal stress. However, in the apparatus, since the coolant branching mechanisms are connected to each other through the flexible bellows, it is possible to moderate the thermal deformation and the thermal stress, generated in the structure, by means of the elongation/contraction of the bellows. With respect to the elongation/contraction, the stress suppression of the bellows axial direction is relatively easily performed. In the oblong bellows shown in FIG. 17, the thermal deformation in the direction perpendicular to the axial direction of the bellows may readily be absorbed. Although the oblong bellows has been described in conjunction with FIGS. 18 and 19, the following point should be understood. Namely, the spring constant k at which the bellows is bent along the plane passing through the short diameter as shown in FIG. 18 is kept small, whereas the spring constant k at which the bellows is bent along the plane passing through the long diameter as shown in FIG. 19 is kept large. Therefore, as shown in FIG. 17, when the long diameter is located perpendicular to the base plate, if the thermal deformation is generated, the bend corresponds to the short diameter surface 15a having a small spring constant of the bellows against the deformation in the direction perpendicular to the axial direction of the bellows, to thereby absorb the thermal stress in the direction perpendicular to the axial direction of the bellows. Therefore, with such bellows arrangement, it is possible to moderate the thermal stresses in the axial direction of the bellows and the direction perpendicular to the axial direction.

Figure 20:
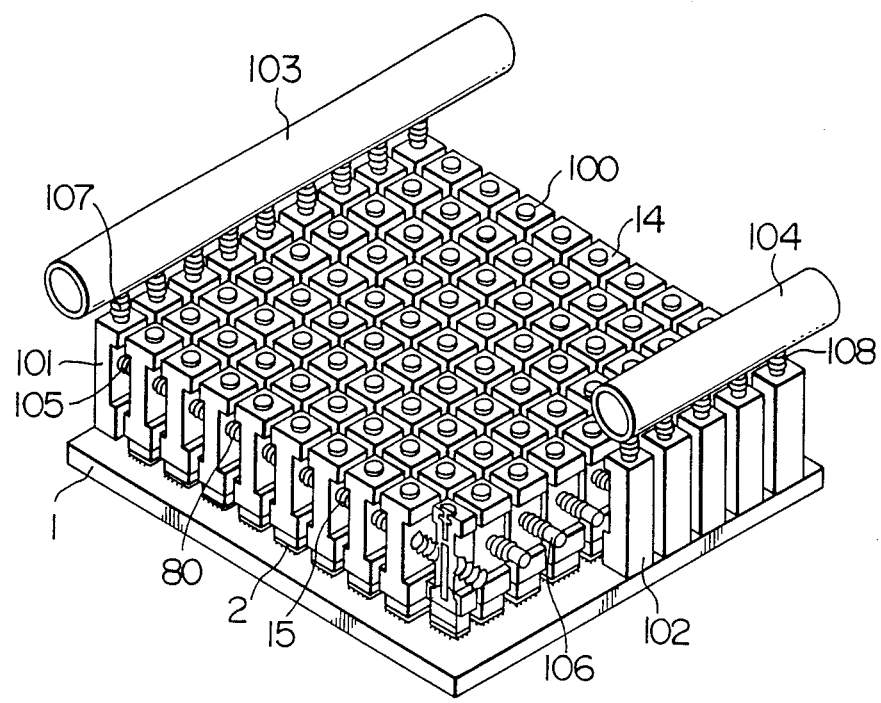
FIG. 20 is an overall perspective view showing the semiconductor cooling apparatus composed of a series of units in accordance with the embodiment of the invention.

FIG. 20 is a perspective view showing a semiconductor cooling apparatus which is composed of a plurality of connected series structure unit in accordance with an embodiment of the invention. A plurality of heated chips arranged on the base plate 1 are cooled. In FIG. 20, heated chips 9×9=81 are arranged as an example. The coolant branching mechanisms 14 associated with the respective heated chips 2 are connected to each other through main flow pipes 80. In the embodiment shown in FIG. 20, nine rows of series structures 100 are each composed of nine coolant branching mechanisms connected to each other through the flexible bellows 15. Coolant header pipes 101 and 102 are arranged at ends of the series structures 100 and are fixed to the base plate 1. Therefore, the nine coolant header pipes 101 and 102 are, respectively, arranged at both ends of the respective series structures 100 of the base plate 1 (in case of FIG. 20). Main pipes 103 and 104 extend along the nine coolant header pipes 101 and 102. Flow paths for the coolant are formed in the coolant header pipes 101 and 102. One end of each flow path is connected through the flexible bellows 105 or 106 to the coolant branching mechanism. The other end is connected through the flexible bellows 107 or 108 to the main pipe 103 or 104. Therefore, the coolant that has been introduced into the left side main pipe 103 in FIG. 20, for example, is divided into the nine parts to pass through the flexible bellows 107, the coolant header pipes 101, and the flexible bellows 105 in this order. The coolant is further allowed to flow into the series structure 100 to be introduced into the respective cooling blocks to cool the heated chips. Then, the coolant is introduced through the flexible bellows 106, the coolant header pipes 102 and the flexible bellows 108 to the main flow pipe 104. The function of the flexible bellows 105 and 106 to balance the thermal stress with the bellows being provided on opposite surfaces of the coolant branching mechanism. The function of the flexible bellows 107 and 108 is to prevent the stress, applied to the main pipes 103 and 104, from being applied to the series structure 100 through the coolant header pipes 101 and 102.

With such an arrangement in accordance with the embodiment of the invention, since the cooling blocks and the heated chips are first coupled with each other by solder or the like, the heat, generated from the heated chip, may be transmitted to the coolant that flows through the cooling blocks, with a high efficiency. At the same time, the coolant that has flowed through the flow paths is sealed by the O-rings.

Since the O-ring fastening mechanism is provided on the opposite side to the heated chips or the base plate with respect to the cooling blocks to perform the O-ring seal, it is easy to perform the removal or mounting of the coolant branching mechanism and the main flow pipes through which the coolant is supplied to the cooling blocks. At this time, it is unnecessary to remove the soldered portions between the cooling blocks and the heated chips.

In operation of the semiconductor cooling apparatus, the heated chips are kept at a relatively high temperature, whereas the components through which the coolant flows is kept at a relatively low temperature. Therefore, the thermal stress or the like is likely to be generated. Also, the chips are likely to receive the stress due to the assembling precision or the like. In the embodiment, the main flow pipes are made of flexible bellows. Thus, it is possible to moderate the stress with the flexible pipes. Accordingly, in the embodiment, it is possible to suppress the stress to be applied to the heated chips and to prevent the damage of the soldering balls used for the electrical connection between the heated chips and the base plate to prolong the service life.

Furthermore, according to the embodiment, all the coolant is not allowed to be introduced on the back surfaces of the respective heated chips, but only a necessary amount of the coolant is caused to flow to the back surfaces of the heated chips. It is possible to introduce the coolant kept at a relatively low temperature to the respective heated chips. Accordingly, it is possible to cool the heated chips even if the heat quantity of the heated chips is large. Also, according to the embodiment, it is sufficient that a relatively small, minimum possible amount of coolant is caused to flow through spaces of the fine fins as in the cooling blocks. It is therefore possible to suppress the pressure loss concomitant with the flow of the coolant.

Figure 21:
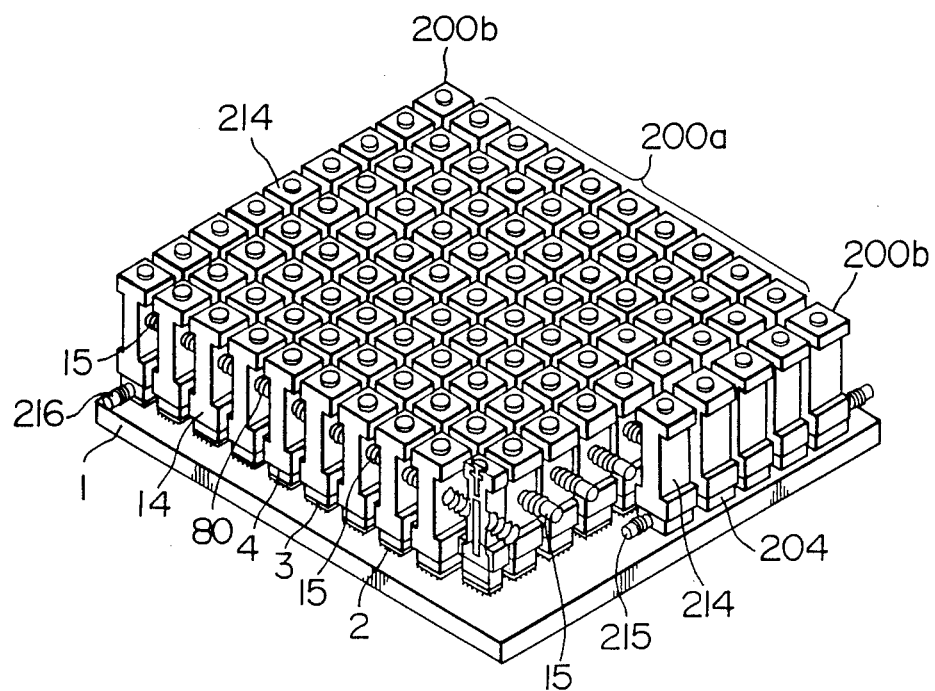
FIG. 21 is an overall perspective view showing the semiconductor cooling apparatus composed of a series of units in accordance with another embodiment of the invention.
Figure 22:
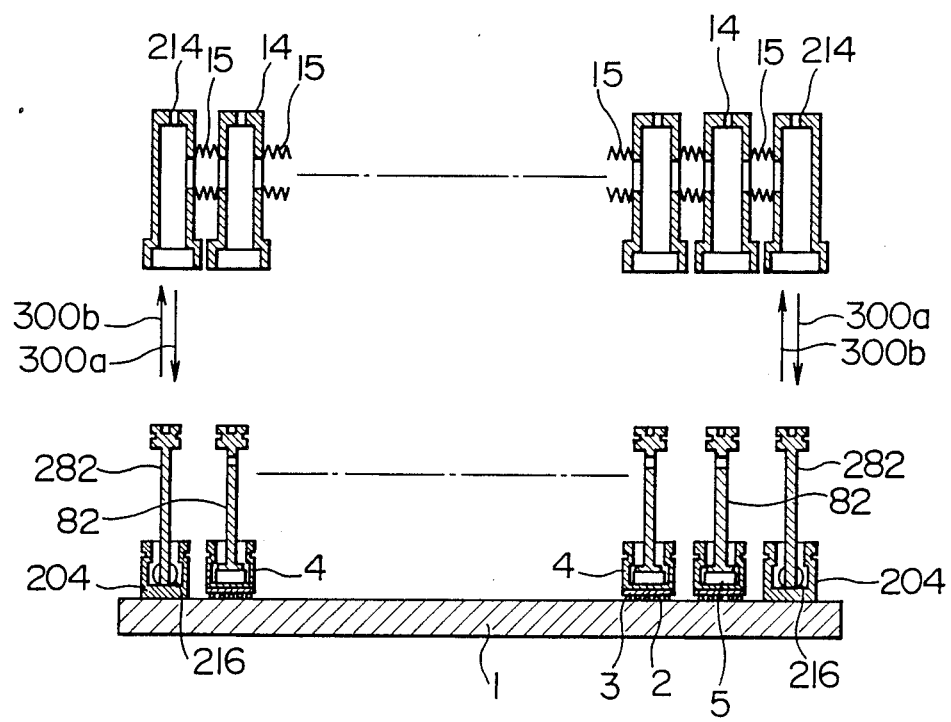
FIG. 22 is a cross-sectional view showing an assembling method of cooling apparatus shown in FIG. 21.

Another modification of a semiconductor cooling apparatus which is composed of a plurality of connected series structure unit in accordance with an embodiment of the invention will be explained with reference to FIGS. 21–23. FIG. 21 is a perspective view showing a semi-conductor cooling apparatus. FIG. 22 shows an assembling method of cooling apparatus shown in FIG. 21. FIG. 23 shows a structure of a coolant header pipe connected at the ends of the series structures. As shown in FIG. 21, a plurality of heated chips 2 mounted on the base plate 1 are cooled. In that Figure, the case with 81 heated chips 9 columns by 9 rows) is demonstrated as an example. The coolant branching mechanisms 14 assembled with the respective heated chips 2 are connected to each other through main flow pipes 80. In the embodiment shown in FIGS. 21 and 22, eleven columns of series structures 200a, 200b are each composed of nine coolant branching mechanisms 14 and two coolant branching outer headers 214 connected to each other through the flexible bellows 15. Nine rows of series coolant branching inner headers 204 are combined to the bottoms of the coolant branching outer headers 214 and are fixed to the base plate 1. Each of them are connected through flexible bellows 215 which constitute main header pipes. As shown in FIG. 23 the coolant header pipe consists of two separable parts, the coolant branching inner header and the coolant branching outer header. They are assembled using two pieces of O-rings 292a, 292b which seal the coolant. A part of the coolant flowing in a coolant header pipe flows to the series structure 200a (arrows 293a, 294, 295) and the rest of the coolant (arrow 293b) flows to the adjacent coolant header pipe through flexible bellow 215. The parts fixed to base plate 1, i.e. cooling blocks 4 and two coolant branching inner headers, and the series structuresd 200a, 200b are separable. As shown in FIG. 22, when assembling the cooling apparatus, the series structures 200a, 200b composed of coolant branching mechanisms 14 and coolant branching outer headers 214 are set together on the parts fixed to base plate (arrow 300a). And when disassembling the cooling apparatus, the series structures are pulled out (arrow 300b). According to the embodiments shown in FIGS. 21 to 23, since each row of series structures is isolated, when repairing the heated chip, only one row of series structures attached to the repairing heated chip is disassembled. And, since the main header pipes are fixed to the base plate, the disassembling is easily done.

Figure 24:
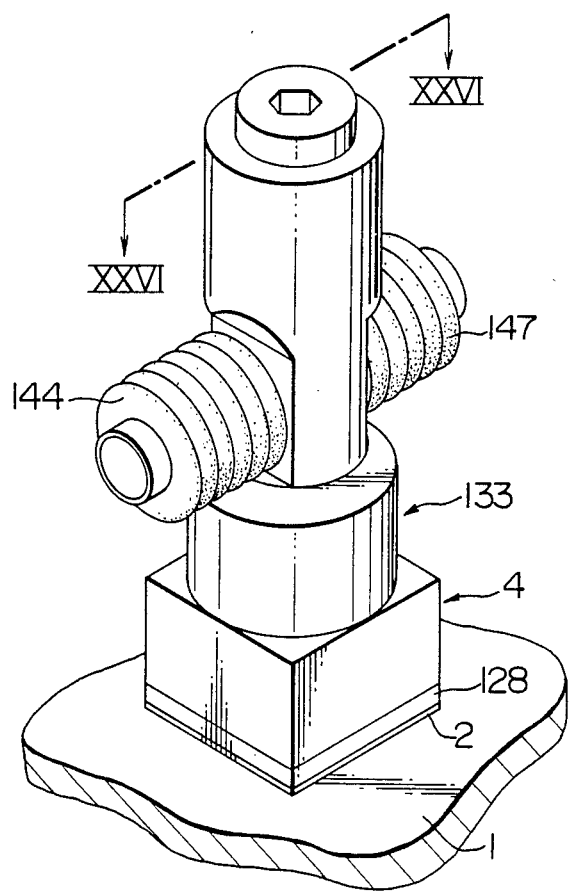
FIG. 24 is a perspective view showing a unit according to still another modification.
Figure 25:
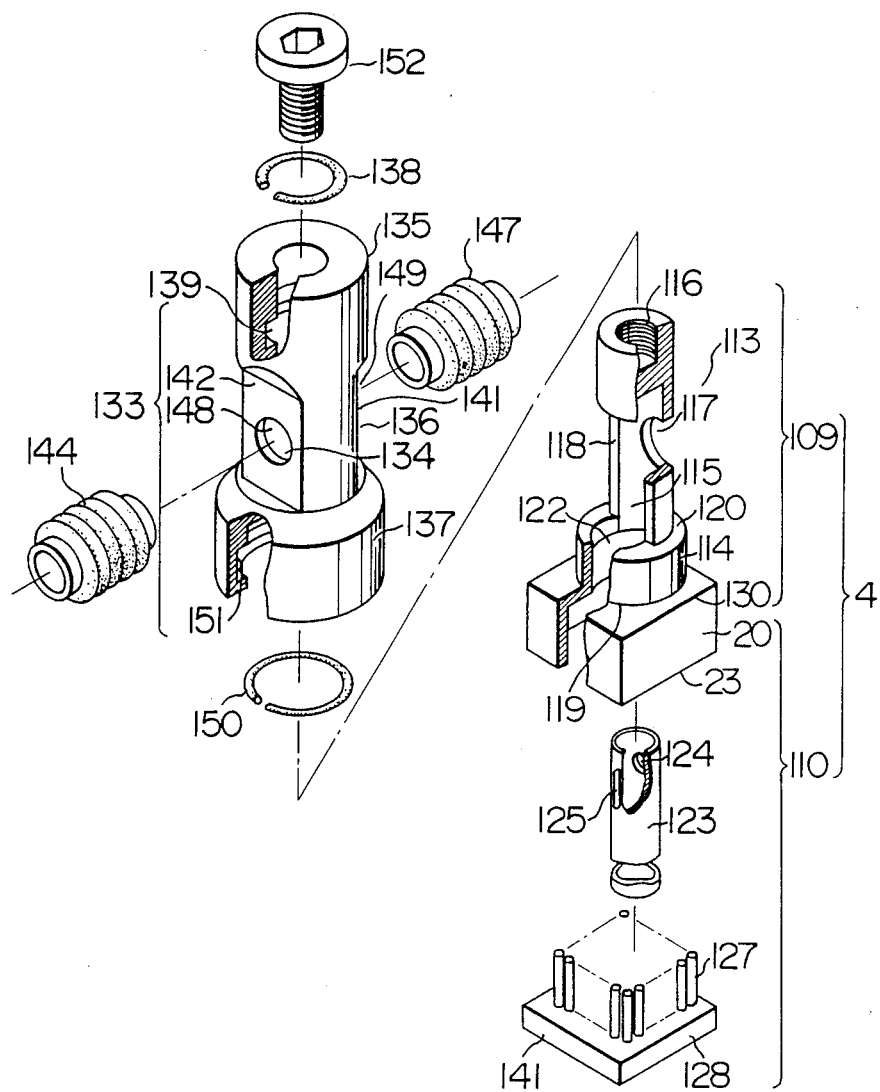
FIG. 25 is an exploded perspective view showing the unit shown in FIG. 24.
Figure 26:
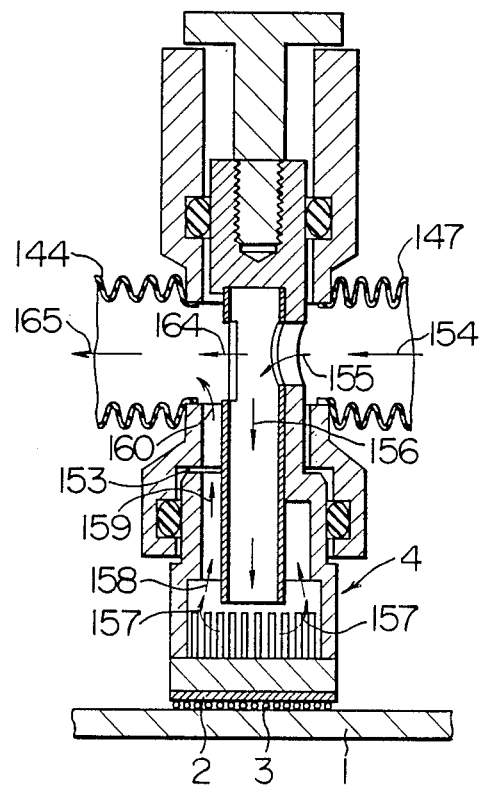
FIG. 26 is a cross-sectional view taken along the line XXVI—XXVI of FIG. 24.

Still another modification of the invention will be explained with reference to FIGS. 24, 25 and 26. FIG. 24 is a perspective view of the device, FIG. 25 is an exploded perspective view showing the components, and FIG. 26 is a cross-sectional view taken along the line XXVI—XXVI of FIG. 24, showing the flow direction of the coolant.

A number of heated chips 2 (only one shown in FIGS. 24 and 26) are arranged on a wiring base plate 1. The signal wires therebetween are connected to each other with soldering balls 3. A cooling block 4 is arranged on a rear surface of the heated chip (the opposite surface to the surface connected by soldering) for cooling the heated chip to keep constant the temperature of the semiconductors within the chip. The cooling block 4 has a cylindrical shape. The cooling block 4 includes a two-flow path portion 109 having an inlet and outlet for the coolant and a cooling portion 110 having cooling fins for cooling the heated chip with coolant, each fin having a rectangular cross-section.

The two-flow portion 109 is composed of a small outer sleeve 113, a large outer sleeve 114 and a small inner sleeve 123. A small outer sleeve has a cylindrical inner flow path 115 extending to a midway along the center axis and has a screw hole 116 along the center axis at an upper end portion (opposite end to the large outer sleeve 114). The screw hole 116 is not extended to the cylindrical inner path 115. A single coolant inlet 117 is formed toward the center axis of the inner flow path 115 on the side wall of the small outer sleeve 113. A large cutaway portion 118 is formed opposite to the coolant flow inlet 117 with respect to the center axis of the inner flow path 115. A depth of the cutaway portion 118 reaches the inner flow path 115. On the other hand, the cutaway portion 118 extends from the end face opposite to the surface close to the screw hole 116, to the vicinity of the end of the inner flow path. On the other hand, the large outer sleeve 114 has a larger diameter than that of the small outer sleeve 113 and has an open end and a closed end 120. An opening 121 to which the small outer sleeve 113 may be inserted is formed in the central portion of the large outer sleeve 114. An opening 122 such that the large outer sleeve 114 may form a maximum cylinder is formed eccentrically from the center axis of the large outer sleeve 114. The outer diameter of the small inner sleeve 123 is substantially the same as the inner diameter of the inner flow path 115 of the small outer sleeve 113 so that the small inner sleeve may be inserted into the inner flow path 115. Then, a flow inlet opening 124 that has substantially the same size as that of the coolant inlet 117 formed in the inner flow path 115 is formed on the side wall of the small inner sleeve 123. A slit opening 125 is formed opposite to the flow inlet opening 124 with respect to the center axis of the small inner sleeve 123. When the small inner sleeve 123 is inserted into the inner flow path 115 of the small outer sleeve 113 so that the end of the small inner sleeve 123 is brought into contact with the end of the inner flow path 115, the coolant inlet 117 and the flow inlet opening 124 are aligned with each other. This structure is convenient for assembling work. Under the condition that the coolant inlet 117 and the flow inlet opening 124 are also aligned in the circumferential direction, the small outer sleeve 113 and the small inner sleeve 123 are coupled to each other with brazing or the like. Thus, the two-flow path portion 109 is formed.

The cooling portion 110 is formed of a box 126 having a rectangular cross-section, and a fin plate 128 in which a number of rod-like or plate-like fins 127 are implanted. The box 126 is opened at one side 129 and closed at the other side 130. A large opening 140 to which the small inner sleeve 123 is inserted and connected is formed along the center line of the box 126. The fin plate 128 has substantially the same size as that of the heated chip 2. Also, the size of the fin plate 128 is substantially the same as that of the box 126. Then, the group of the rod-like fins 127 are inserted into the box 126 and the box 126 and the fin plate 128 are coupled to each other by silver brazing. Thus, the cooling portion 110 is formed.

The length of the small inner sleeve 123 is selected so that one end of the small inner sleeve 123 is positioned close to the ends of the fin rods 127. The surface 141 of the fin plate 128 of the cooling portion 110 where none of the fin rods are provided is connected to a back surface of the chip 2 by soldering or the like. The coolant is introduced from the coolant flow inlet 117 and the flow inlet opening 124 to the small inner sleeve 123 further to the spaces between the rod-like fins 127. At this time, the coolant is used to cool the chip 2 through the fin plate 128. The coolant that has been used to cool the chip is discharged from the opening 122. A part of the coolant that has been introduced from the flow inlet opening 124 passes through the slit opening 125 and hence is not allowed to flow toward the rod fins 127. This coolant is not used to cool the chip. These two flows are emerged and discharged.

Subsequently, the coolant pipe 133 in which the coolant is introduced to the cooling block 4, and further, the coolant that has been used to cool the chip and the coolant that passes through the slit opening 125 without cooling the chip are merged together and discharged will be explained. The coolant pipe 133 has a hollow portion 134 in the central portion thereof. The coolant pipe 133 is composed of a pipe fixing mechanism 135 for sealing the coolant by an annular, relatively small O-ring, a coolant flow inlet/outlet portion 136 having two planar portions, and a coolant sealing mechanism 137 with O-ring. A groove 139 into which an O-ring 138 is inserted is formed at the inner wall of the pipe fixing mechanism 139. The two-flow portion 109 of the cooling block 4 is inserted into the hollow portion of the pipe fixing mechanism and is sealed by the O-ring 138.

The coolant inlet/outlet portion 136 has a central cylindrical hole into which the two-flow path portion 109 of the cooling block 4 may be inserted. The two diametrically opposite planar portions 142 and 143 have openings 148 and 149 into which the bellows 144 and 147 are inserted. The size of the openings 148 and 149 is larger than that of the coolant flow inlet 117 formed in the small outer sleeve 113.

A groove 151 into which an O-ring 150 is inserted is formed in an inner wall of the coolant seal mechanism 137. The hollow portion has the cylindrical portion into which the cooling block sleeve 114 is inserted to sufficiently seal the liquid by the O-ring.

The two-flow portion 109 of the cooling block 4 is inserted into the hollow portion 134 of the coolant pipe 133 to form a cooling apparatus for cooling the heated chips 2. The O-rings 138 and 150 are inserted into the grooves 139 and 151, respectively. Subsequently, the two-flow portion 109 of the cooling block 4 is inserted into the hollow portion 134 of the coolant pipe 133. Then, a bolt 152 is inserted into the end face of the pipe fixing mechanism 145 and engaged with the screw hole 116 of the two-flow path portion 109. The cooling block 4 and the coolant pipe 133 are fastened to each other. Under such a condition, the O-rings 138 and 150 held in the grooves 139 and 151 are brought into contact with the outer walls of the small outer sleeve 113 and the large outer sleeve 114 to seal the liquid. At this time the end 120 of the large outer sleeve 114 is provided with a small gap 153 in order not to contact the inner wall of the hollow portion 134 of the coolant pipe 133.

The flow direction of the coolant will be explained with reference to FIG. 26. The arrows in FIG. 26 show the flow direction. The coolant 154 that has been introduced from the right bellows 147 in FIG. 26 is first allowed to pass through the coolant flow inlet 117 and the flow inlet opening 124 and is supplied to the small inner sleeve 123 as indicated by the arrow 155. A part of the flow amount of the coolant is introduced into the small inner sleeve 123 to flow through the group of a number of fin rods 127 as indicated by the arrow 156. The coolant flows between the fin rods 127 to cool the fin rods 127 and the fin plate 128 as indicated by the arrow 157. At this time, the coolant itself is heated. The heated coolant flows between the small inner sleeve 123 an the small outer sleeve 114 as indicated by the arrow 158, and subsequently flows between the inner small sleeve 123 and the small outer sleeve 113 as indicated by the arrow 159. Then, the coolant flows between the small inner sleeve 123 and the coolant flow inlet/outlet portion 136 as indicated by the arrow 160. On the other hand, the other part of the coolant that passes through the flow inlet opening 124 is allowed to path through the slit opening 125. The coolant is not used to cool the chip 2. The flows 160 and 164 of the coolant are merged and the coolant is discharged through the left bellows 144 as indicated by the arrow 165.

The effect will be explained. The stress moderating mechanism formed by the flexible bellows 144 and 147 will be explained. In operation of the apparatus, the chips 2 emit heats, so that the chips 2 and the base plate 1 are kept at a relatively high temperature, whereas the cooling block 4 and the coolant pipe 133 through which the coolant flows are kept at a relatively low temperature. Therefore, in the apparatus assembled at a room temperature, there is a temperature gradient in operation to generate the thermal deformation in the structure. However, since the coolant pipe 133 is interposed between the flexible bellows 144 and 147, it is possible to absorb the thermal deformation with the flexible bellows 144 and 147.

According to this embodiment, all the coolant does not flow through the cooling blocks associated with the respective heated chips but a necessary amount of the coolant flows through the cooling blocks by the branching mechanisms. Therefore, the coolant may flow through narrow flow paths to suppress the flow rate and the pressure loss.

According to this embodiment, since the coolant that has been introduced from the small inner sleeve 123 is introduced to the central portion of the fin group 127 of the fin plate 128 in order to absorb heats transmitted from heated chips 2, it is possible to cool effectively the portion of the heated chip where the thermal gradient is remarkable.

According to the embodiment, since the cooling block 4 and the heated chip 2 are coupled to each other with soldering or the like, it is possible to transmit the heat, emitted from the chip, to the cooling block.

According to the embodiment, the cooling block and the heated chip are coupled to each other by soldering or the like. Then, the flow paths of the coolant are connected through the O-rings. Therefore, its assembling property is superior. Furthermore, in the case where the chip is defective for any reason, it is necessary to remove the cooling apparatus, but in this case, the bolt 152 for coupling the cooling block 4 and the coolant pipe 133 is simply loosened, so that the cooling block 4 and the coolant pipe 133 may be separated from each other at the O-rings 138 and 150.

Figure 27:
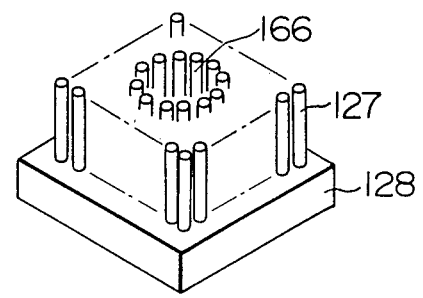
FIG. 27 is a perspective view showing a cooling block part according to another embodiment of the invention.
Figure 28:
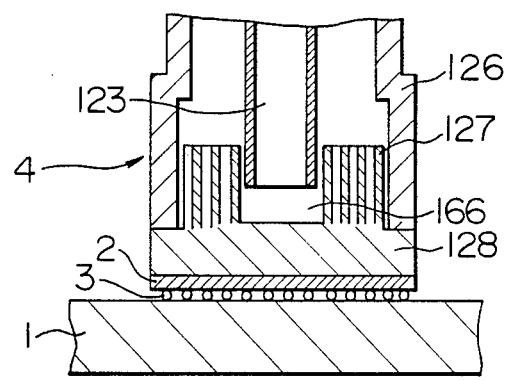
FIG. 28 is a cross-sectional view showing the cooling block shown in FIG. 27.

An example of the unit structure near the cooling block to which the present invention pertains will now be described. In FIG. 27, a space 166 that is larger than the outer size of the small inner sleeve 123 to be connected to the cooling block is formed in the central portion of the rod-like or plate-like fins 127 of the fin plate 128 to be connected to the chip of the cooling block by soldering or the like. FIG. 28 is a cross-sectional view showing the cooling block 4 on the heated chip side, showing the assembled state where the fin plate shown in FIG. 27 is used. In FIG. 26, the coolant introduced into the small inner sleeve 123 connected to the cooling block 4 is introduced into the rod fins 127 in the fin plat 128 for transmitting the heat from the heated chips 2. In the case where the gaps are formed between the small inner sleeve 123 and the rod fins 127, the flow resistance of the coolant flowing through the gaps is smaller than that of the coolant flowing through the rod fins 127. As a result, a large amount of the coolant is flowed between the small inner sleeve 123 and the rod fins 127. Thus, it is impossible to effectively transmit the heat from the heated chips.

According to the embodiment, this defect is overcome by the arrangement shown in FIGS. 27 and 28. Namely, as shown in FIG. 28, the fin plate 128 of the cooling block 4 to be soldered to the heated chip 2 as shown in FIG. 28 is constructed as shown in FIG. 27 so that the small inner sleeve 12 connected to the cooling block 4 is elongated so as to enter the space 166 provided in the central portion of the fin plate 128.

According to this embodiment, the coolant that has been introduced into the fin plates 128 by the small inner sleeve 13 connected to the cooling block 4 is positively discharged from the small inner sleeve 123 within the fins 127 of the fin plate 128. Therefore, the coolant flows to remove the heat generated in the heated chip.

Figure 29:
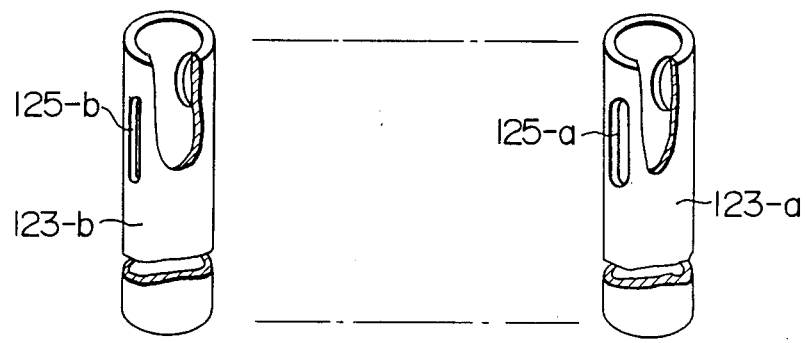
FIG. 29 is a partial cross-sectional and perspective showing still another embodiment of the invention.

Parts to which the invention pertains will now be described with reference to FIGS. 29 and 30. FIG. 29 shows a small inner sleeve 123 for introducing the coolant to the fin plate side, which sleeve is to be connected to the cooling block inner wall to form a plurality of series structures in correspondence with the heated chips. The coolant introduced into each cooling block is allowed to flow from the cooling block side to which the small inner sleeve 123-a is connected to the cooling block side to which the small inner sleeve 123-b is connected through a plurality of cooling blocks. Under such a condition, in the case where the cooling blocks to which the small inner sleeves 123 having the same cut-away area are coupled to the heated chips, the temperature of the coolant passed through the cooling block to which the small inner sleeve 123-a is attached is increased to absorb the heat corresponding to a single chip. As a result, the heated coolant is introduced into the next cooling block. Therefore, the heat transfer efficiency will be degraded. The temperature difference is increased between the cooling blocks to which the small inner sleeves 123-a are attached and the cooling blocks to which the small inner sleeves 123-b are attached. As a result, the stability in performance of the heated chips is not ensured. According to the present invention, the temperature difference between the heated chips is minimized as much as possible. The ratio between the amount of flow of the coolant flowing to the heated chips from the small inner sleeves connected to the cooling block and the discharge amount through the slits of the small inner sleeve is changed. Namely, the area of the slit 125-a of the inner sleeve 123-a connected to the cooling block which is located close to the coolant pipe on the flow inlet side without the temperature increase. On the other hand, the area of the slit 125-b of the sleeve 123-b connected to the cooling block of the discharge side coolant main pipe. The corresponding areas of the cooling blocks therebetween is changed gradually.

Figure 30:
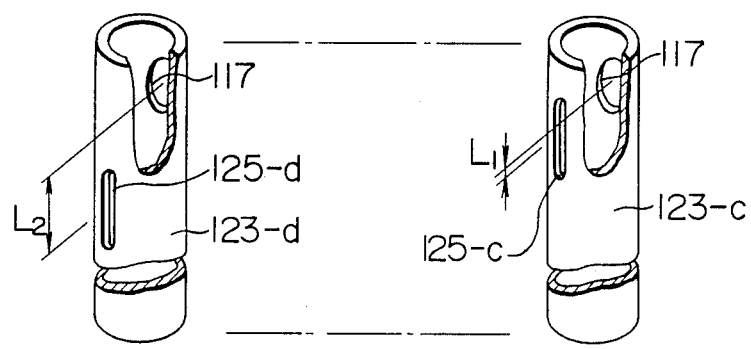
FIG. 30 is a partial cross-sectional and perspective view showing another part of the invention.

Also, FIG. 30 shows another embodiment for decreasing the temperature increase of the coolant as illustrated in conjunction with FIG. 29. In the sleeves located close to the flow inlet side coolant main pipe, a distance $L_1$ between the coolant inlet 117 formed in the sleeve and the center of the slit is short and the distance $L_2$ between the coolant inlet of the sleeve on the discharge side coolant main pipe and the center of the slit is large. The positions of the slits 125-c and 125-d formed in the sleeve connected to the cooling blocks are thus selected.

As described above, according to the embodiments shown in FIGS. 29 and 30, it is possible to cause a small amount of coolant where the temperature of the coolant to flow introduced into the cooling block is low, and to cause a large amount of coolant to flow where the coolant passed through the blocks and heated in temperature is introduced, with respect to the fin plate. It is possible to suppress the difference in temperature of the respective heated chips.

According to the embodiments shown in FIGS. 24 to 30, since the cooling blocks and the heated chips are coupled by soldering or the like, it is possible to effectively transmit the heat, emitted from the heated chip, to the coolant flowing through the cooling block. At the same time, the coolant flowing through the flow path may be sealed by the O-rings. The O-ring is fastened by the O-ring fastening mechanism located opposite to the heated chip or base plate with respect to the cooling block. Therefore, it is easy to perform the mounting or removing work of the coolant supply pipes for supplying the coolant. At this time, there is no need to remove the soldering contact between the cooling block and the heated chip.

In case of operation of the semiconductor cooling apparatus, the heated chip and the base plate are kept at a relatively high temperature, whereas the cooling block and the coolant pipe through which the coolant flows are kept at a relatively low temperature, thereby generating the thermal stress or the like. Also, due to the assembling precision or the like, the stress is likely to be generated in the heated state of the chips.

According to the invention, since the main flow paths are made of flexible bellows or the like, the thermal stress may be moderated by the flexible pipe. Therefore, it is possible to suppress the stress applied to the chips and to prevent the damage of the electrical connection between the heated chips and the base plate to prolong the service life.

Furthermore, according to the embodiments of the invention, all of the coolant is not introduced into the chip back surfaces, but a necessary flow amount is allowed to flow thereto. The relatively low temperature coolant is introduced to the chips. Therefore, even if the amount of the heat emitted from the chips is increased, it is possible to cool the chips.

Also, since it is sufficient to flow a relatively small amount of coolant through the cooling block minute fin rows, it is possible to suppress the pressure loss concomitant with the coolant flow.

Figure 31:
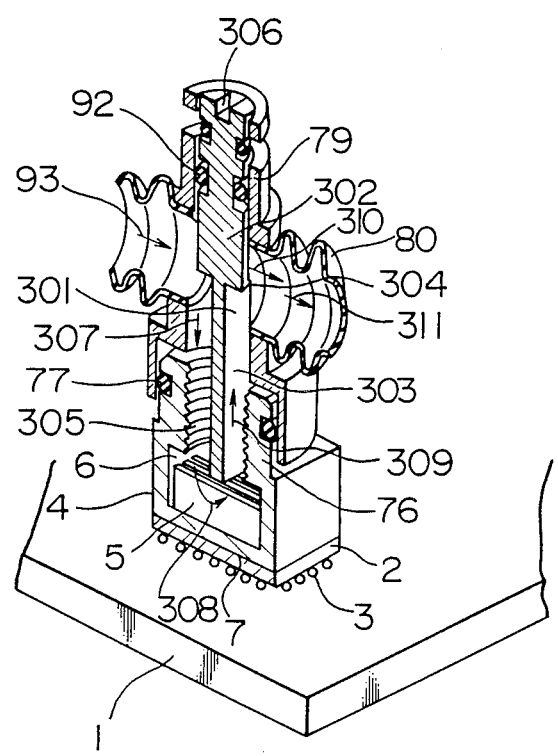
FIG. 31 is a partial cross-sectional and perspective view showing an unit of a semiconductor cooling apparatus in accordance with another modification.

Another modification of the invention will be described with reference to FIG. 31. The modification is an improvement of the invention shown in FIG. 15. A branching mechanism 301 inserted into the branching pipe 79 consists of a planar butterfly valve 302, a planar baffle plate 303 and a circular plate 304. The planar butterfly valve 302 is provided perpendicular to the planar baffle plate 303. The branching mechanism 301 having a screw portion (not shown in FIG. 31) at the end of the planar baffle plate 3 is inserted into the screw hole 305 of the cooling pipe 76. The branching mechanism 301 can be rotated freely by means of a screw driver (not shown in FIG. 31) to the groove portion 306 that is formed at the end portion of the branching mechanism 301.

The flow direction of coolant such as water will now be described. The flow direction is shown by arrows in FIG. 31. A part of the coolant that has been introduced from, for example, the left side of the main flow pipe 80 (arrow 93) is allowed to flow toward the cooling block 4 (arrow 7). The coolant (arrow 8) that has flowed through the fins 5 is allowed to flow toward the main flow pipe 80 (arrow 309). On the other hand, the rest of the coolant (arrow 93) that has been introduced from the left side of the main flow pipe 80 is allowed to flow around the planar butterfly valve 302 (arrow 310). The coolant is then merged with the coolant that is flowing the direction indicated by the arrows 309 and 310 to flow in the right within the main flow pipe 80 in FIG. 31 (arrow 311). When the coolant has flowed between the fins 5 of the fin row 6, the coolant is used to cool the heated chip 2 through the fins 5 and the surface 7.

The effect will be explained. In the foregoing apparatus, the branching plate 1 can be rotated freely by means of a screw driver outside of the cooling apparatus. And then, a necessary flow rate of coolant is rendered to flow through the respective cooling block by controlling the revolution rate of the branching plate 1.

Figure 32:
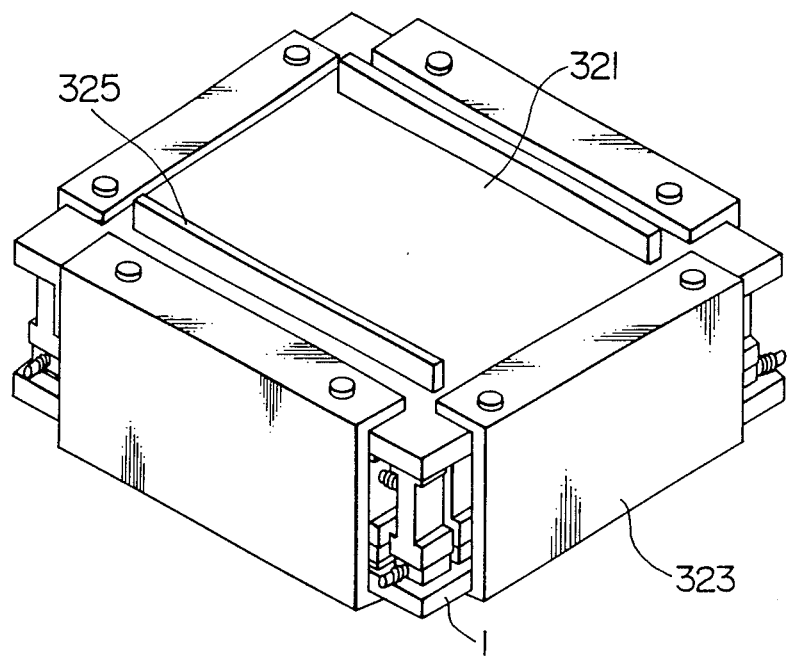
FIG. 32 is an overall perspective view showing the semiconductor cooling apparatus composed of a series of units in accordance with another modification of the invention.
Figure 33:
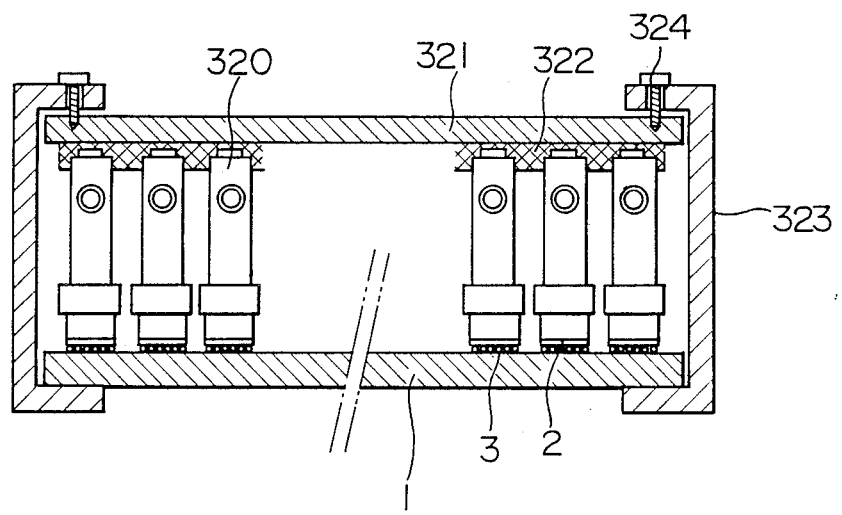
FIG. 33 is a cross-sectional view showing a structure of a semiconductor cooling apparatus shown in FIG. 32.

FIG. 32 and FIG. 33 show a modification of the cooling apparatus structure against an earthquake and shock for transportation.

FIG. 32 is a perspective view showing a semiconductor cooling apparatus which is composed of a plurality of connected series structure unit in accordance with an embodiment of invention. FIG. 33 is a cross-sectional view showing an unit structure of semiconductor cooling apparatus of FIG. 32.

In the embodiment shown in FIG. 33, nine rows of series structures 320 cross at right angles in the Figure. Press down plate 321 is installed on the top side (opposite side to base plate 1) of each of the nine rows of the series structure 320.

One side of this plate 321 is installed on rubber layer 322 and it contacts on each structure 100. The size of this plate 321 is substantially the same as the base plate 1 and the shape is plane.

As shown in FIG. 32, the cooling apparatus is pinched between press down plate 321 and base plate 1, and four clamping frame 323 is fixed to both plates by tightening the screws 324.

With such a structure, it is possible to prevent vibration on the semiconductor cooling apparatus which is composed of nine rows of series structures 320.

As has been described above, according to the present invention, it is possible to enjoy the following advantages.

(i) It is possible to reduce a thermal resistance by the LSI-liquid cooling structure with soldering.

(ii) It is possible to reduce the load against the LSIs by the flexible structures such as bellows deformation, O-ring deformation, packing deformation or the like and by the temperature difference elimination.

(iii) It is possible to enhance a repair property of LSIs in attachment between the cooling block and the coolant supply block.

What is claimed is:

1. A semiconductor cooling apparatus comprising:
cooling blocks to be individually attached to plural semiconductor chips disposed on a base plate, each cooling block to be brazed to form one united body with a corresponding semiconductor chip and having an inner space for a flow of coolant;
coolant supply blocks provided separately from one another in one-to-one corresponding relation to said cooling blocks, each coolant supply block having an inner space for supply of coolant to a corresponding cooling block;

flexible piping connecting adjacent coolant supply blocks with each other in series;

sealing means for detachably connecting each cooling block with a corresponding coolant supply block; and flow path partition means respectively provided in said inner spaces of each cooling block and a corresponding coolant supply block for forming at least two substantially separated flow paths for the coolant when said partition means of each cooling block and said partition means of a corresponding coolant supply block are fitted to each other.

2. The apparatus according to claim 1, wherein said flexible piping comprises a plurality of flexible bellows, and each flexible bellows is arranged so that a center axis thereof is substantially parallel to a surface of said plate on which said semiconductor chips are disposed.

3. The apparatus according to claim 1, wherein said flexible piping comprises a plurality of flexible bellows, and each flexible bellows has an oblong cross-section and is arranged so that a center axis thereof and a short diameter of the cross-section are parallel to a surface of said base plate on which said semiconductor chips are disposed.

4. The apparatus according to claim 1, wherein each cooling block has a maximum cross-sectional area which is no larger than an area of a back face of a corresponding semiconductor chip, and is so constructed and of such a size as to be within an extent of a corresponding semiconductor chip when viewed from the back side thereof.

5. The apparatus according to claim 1, wherein said coolant supply blocks are connected in series and have opposite ends respectively connected through flexible pipes to coolant headers which are fixedly mounted on said base plate.

6. The apparatus according to claim 5, wherein said flexible piping connecting said coolant supply blocks has a spring effect in an axial direction of said flexible piping, said flexible pipes connecting said coolant supply blocks with said coolant headers have a spring effect in an axial direction of said flexible pipes, and a spring constant of said flexible piping is substantially equal to a spring constant of said flexible pipes.

7. The apparatus according to claim 5, wherein said coolant supply blocks are arranged in plural rows and are connected in series in every row, separate coolant headers are provided for every row of said coolant supply blocks, and each coolant header is connected through a flexible pipe to a coolant main pipe.

8. The apparatus according to claim 5, wherein said coolant supply blocks are arranged in plural rows and are connected in series in every row, separate coolant headers are provided for every row of said coolant supply blocks, and adjacent coolant headers are connected with each other through a flexible pipe.

9. The apparatus according to claim 5, wherein each coolant header is composed of an outer header which is connected through said flexible pipe to the end of said coolant supply blocks, and an inner header which is fixedly mounted on said base plate, and said outer header and said inner header are detachably coupled to each other by means of a sealing member.

10. A semiconductor cooling apparatus comprising:
cooling blocks adapted to be individually attached to plural semiconductor chips disposed on a base plate, each cooling block to be brazed in one united body with a corresponding semiconductor chip and having an inner space for a flow of coolant;

coolant supply blocks provided separately from one another in one-to-one corresponding relation to said cooling blocks, each coolant supply block having an inner space for supply of the coolant to a corresponding cooling block and having one of an inner pipe provided in said inner space of the coolant supply block and fin rows provided at a bottom of said inner space of the coolant supply block;

flexible piping connecting said coolant supply blocks with one another in series and having a pipe axis substantially parallel to a surface of said base plate;

sealing means for detachably connecting each cooling block with a corresponding coolant supply block; and an inner pipe provided in said flexible piping for forming a flow path through said coolant supply blocks, said inner pipe having branches at corresponding positions thereof to said cooling blocks, each branch being formed in a T-shape and a branching end thereof being fitted to one of said inner pipe and said fin rows of each cooling block.

11. The apparatus according to claim 10, wherein said flexible piping comprises a plurality of flexible bellows, and said inner pipe comprises a flexible pipe.

12. A semiconductor cooling apparatus comprising:
cooling blocks arranged in rows to be individually attached to plural semiconductor chips disposed on a surface of a base plate, each cooling block having an inner space for flow of a coolant;

coolant supply blocks arranged in rows and respectively having inner spaces for supply of the cooling fluid to said cooling blocks;

plural flexible pipes arranged alternately with said coolant supply blocks in succession for connection between adjacent coolant supply blocks to constitute a coolant main flow pipe; and coolant branching mechanism respectively provided in said coolant supply blocks for introducing a part of the coolant flowing through said coolant main flow pipe into each cooling block while allowing a substantial part of the coolant to remain flowing through said coolant main flow pipe, whereby a part of the coolant separated at an inlet of each coolant branching mechanism is introduced into a corresponding cooling block, cools a corresponding semiconductor chip at the bottom of said inner space of the cooling block, is warmed by the chip, then, is mixed at an outlet of the coolant branching mechanism with the coolant flowing through said coolant main flow pipe, is cooled, and flows downstream.

13. The apparatus according to claim 12, wherein each cooling block and a corresponding coolant supply block are detachably connected through a sealing member, and said coolant main flow pipe is arranged so that the pipe axis thereof is substantially parallel to said surface of said base plate.

14. The apparatus according to claim 12, wherein each coolant branching mechanism comprises a plate-like member which is formed with an opening, said opening having an opening area for causing pressure loss which is equivalent to pressure loss in flow of the coolant in each cooling block, so that only a necessary amount of the coolant for cooling each semiconductor chip is introduced into the cooling block.

15. The apparatus according to claim 14, wherein each plate-like branching mechanism is fixed in a corresponding cooling block with a portion of said mechanism, in which said opening is formed, projecting into said coolant main flow pipe of a corresponding coolant supply block, and each plate-like branching mechanism is so constructed that said member is fastened by a fastener from an upper outside position of a corresponding coolant supply block to thereby fasten said sealing member between the coolant supply block and a corresponding cooling block.

16. The apparatus according to claim 14, wherein said openings of the coolant branching mechanism are formed to gradually decrease in opening area from an upstream side of said coolant main flow pipe to a downstream side thereof so that a cooling block situated further downstream along said coolant main flow pipe has a larger amount of the coolant flowing therein.

17. The apparatus according to claim 12, wherein each coolant branching mechanism comprises a cylinder-like tube having a portion which is to project into said coolant main flow pipe, said portion of the tube is formed with a cutout serving as an inlet for the coolant and with a silt serving to divide the coolant into a main flow and a branching flow which is introduced into a corresponding cooling block, and said cutout and said slit are provided at substantially 180 degree opposite positions with respect to a center axis of said cylinder-like tube.

18. The apparatus according to claim 17, wherein said slits of the coolant branching mechanisms are formed to gradually decrease in opening area from an upstream side of said coolant main flow pipe to a downstream side thereof so that a cooling block situated further downstream of said coolant main flow pipe has a larger amount of the coolant flowing therein.

19. The apparatus according to claim 12, wherein each coolant branching mechanism comprises upper and lower plates which are joined at substantially right angles to each other, said upper and lower plates being so arranged that a gap is provided between said upper plate and said coolant main flow pipe of each coolant supply block, with the result that a substantial part of the coolant flows through said gap and the rest of the coolant flows along said lower plate into the cooling block, and each coolant branching mechanism is rotatable by control from outside of a corresponding coolant supplying block to change the size of said gap between the upper plate and the coolant main flow pipe so that the amount of the coolant flowing in every cooling block is changeable from outside of the apparatus in accordance with an amount of heat generated by a corresponding semiconductor chip.

* * * * *